(12) United States Patent
Ishikawa et al.

(10) Patent No.: US 12,091,749 B2
(45) Date of Patent: Sep. 17, 2024

(54) METHOD FOR EPITAXIALLY DEPOSITING A MATERIAL ON A SUBSTRATE BY FLOWING A PROCESS GAS ACROSS THE SUBSTRATE FROM AN UPPER GAS INLET TO AN UPPER GAS OUTLET AND FLOWING A PURGE GAS FROM A LOWER GAS INLET TO A LOWER GAS OUTLET

(71) Applicant: Applied Materials, Inc., Santa Clara, CA (US)

(72) Inventors: Tetsuya Ishikawa, San Jose, CA (US); Swaminathan T. Srinivasan, Pleasanton, CA (US); Matthias Bauer, Sunnyvale, CA (US); Manjunath Subbanna, Bangalore (IN); Ala Moradian, Sunnyvale, CA (US); Kartik Bhupendra Shah, Saratoga, CA (US); Errol Antonio C Sanchez, Santa Clara, CA (US); Michael R. Rice, Pleasanton, CA (US); Peter Reimer, Santa Clara, CA (US); Marc Shull, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/317,565

(22) Filed: May 11, 2021

(65) Prior Publication Data

US 2022/0364229 A1    Nov. 17, 2022

(51) Int. Cl.
*C30B 25/14* (2006.01)
*C23C 16/44* (2006.01)
(Continued)

(52) U.S. Cl.
CPC ...... *C23C 16/4408* (2013.01); *C23C 16/4584* (2013.01); *C23C 16/46* (2013.01);
(Continued)

(58) Field of Classification Search
CPC ......... C30B 25/00; C30B 25/02; C30B 25/08; C30B 25/10; C30B 25/12; C30B 25/14;
(Continued)

(56) References Cited

U.S. PATENT DOCUMENTS 6,130,105 A * 10/2000 Redinbo ................. C23C 16/52
                                                    118/667
6,143,079 A * 11/2000 Halpin .................. C23C 16/481
                                                    118/620

(Continued)

FOREIGN PATENT DOCUMENTS

CN         103088415 A         5/2013

OTHER PUBLICATIONS

International Search Report and Written Opinion dated Aug. 4, 2022 for Application No. PCT/US2022/025772.
(Continued)

*Primary Examiner* — Kenneth A Bratland, Jr.
(74) *Attorney, Agent, or Firm* — Patterson + Sheridan, LLP

(57) ABSTRACT

Embodiments described herein include processes and apparatuses relate to epitaxial deposition. A method for epitaxially depositing a material is provided and includes positioning a substrate on a substrate support surface of a susceptor within a process volume of a chamber body, where the process volume contains upper and lower chamber regions. The method includes flowing a process gas containing one or more chemical precursors from an upper gas inlet on a first side of the chamber body, across the substrate, and to an upper gas outlet on a second side of the chamber body, (Continued)

flowing a purge gas from a lower gas inlet on the first side of the chamber body, across the lower surface of the susceptor, and to a lower gas outlet on the second side of the chamber body, and maintaining a pressure of the lower chamber region greater than a pressure of the upper chamber region.

18 Claims, 9 Drawing Sheets

(51) Int. Cl.
  *C23C 16/458* (2006.01)
  *C23C 16/46* (2006.01)
  *C23C 16/52* (2006.01)
  *C30B 25/10* (2006.01)
  *C30B 25/12* (2006.01)
  *C30B 25/16* (2006.01)

(52) U.S. Cl.
  CPC .............. *C23C 16/52* (2013.01); *C30B 25/10* (2013.01); *C30B 25/12* (2013.01); *C30B 25/16* (2013.01)

(58) Field of Classification Search
  CPC ....... C30B 25/16; C30B 35/00; C30B 35/002; C30B 35/005; C23C 16/44; C23C 16/4401; C23C 16/4408; C23C 16/455; C23C 16/45502; C23C 16/45517; C23C 16/45519; C23C 16/45521; C23C 16/4584; C23C 16/46; C23C 16/52
  USPC ............ 117/84, 88, 102, 200, 204, 928, 937
  See application file for complete search history.

(56) References Cited

U.S. PATENT DOCUMENTS

| | | | |
|---|---|---|---|
| 6,153,260 A * | 11/2000 | Comita | ................. C23C 16/481 118/728 |
| 8,183,132 B2 | 5/2012 | Nijhawan et al. | |
| 8,491,720 B2 | 7/2013 | Ishikawa et al. | |
| 8,568,529 B2 | 10/2013 | Ishikawa et al. | |
| 9,929,027 B2 | 3/2018 | Ranish et al. | |
| 10,145,011 B2 | 12/2018 | Abedijaberi et al. | |
| 10,202,707 B2 | 2/2019 | Ranish et al. | |
| 2003/0219981 A1 | 11/2003 | Ammon et al. | |
| 2005/0103261 A1 | 5/2005 | Von Ammon et al. | |
| 2007/0087533 A1 | 4/2007 | Nishikawa et al. | |
| 2008/0017116 A1 | 1/2008 | Campbell et al. | |
| 2010/0092697 A1 | 4/2010 | Poppe et al. | |
| 2010/0092698 A1 | 4/2010 | Poppe et al. | |
| 2010/0215872 A1 | 8/2010 | Sivaramakrishnan et al. | |
| 2010/0258049 A1 | 10/2010 | Ishikawa et al. | |
| 2010/0258052 A1 | 10/2010 | Ishikawa et al. | |
| 2010/0261340 A1 | 10/2010 | Nijhawan et al. | |
| 2010/0263587 A1 | 10/2010 | Sivaramakrishnan et al. | |
| 2012/0088356 A1 | 4/2012 | Santhanam et al. | |
| 2012/0263875 A1 * | 10/2012 | Brenninger | ......... C23C 16/4585 118/728 |
| 2013/0000558 A1 * | 1/2013 | Hara | ................... C23C 16/4412 118/724 |
| 2014/0137801 A1 | 5/2014 | Lau et al. | |
| 2014/0199056 A1 | 7/2014 | Chang et al. | |
| 2014/0273410 A1 | 9/2014 | Abedijaberi et al. | |
| 2014/0322897 A1 | 10/2014 | Samir et al. | |
| 2016/0056059 A1 | 2/2016 | Sun et al. | |
| 2016/0289830 A1 | 10/2016 | Abedijaberi et al. | |
| 2016/0362813 A1 * | 12/2016 | Bao | .................. H01L 21/02293 |
| 2018/0005856 A1 | 1/2018 | Chang et al. | |
| 2018/0209043 A1 | 7/2018 | Lau et al. | |
| 2020/0071832 A1 | 3/2020 | Lau et al. | |
| 2020/0385866 A1 | 12/2020 | Srinivasan et al. | |
| 2021/0013055 A1 | 1/2021 | Schaller et al. | |
| 2021/0189593 A1 | 6/2021 | Burrows et al. | |
| 2022/0178022 A1 * | 6/2022 | Lin | .................. H01L 21/67103 |

OTHER PUBLICATIONS

International Search Report and Written Opinion for International Application No. PCT/US2022/025540 dated Aug. 4, 2022.

Korean Office Action dated Jun. 24, 2024 for Application No. 10-2023-7024874.

* cited by examiner

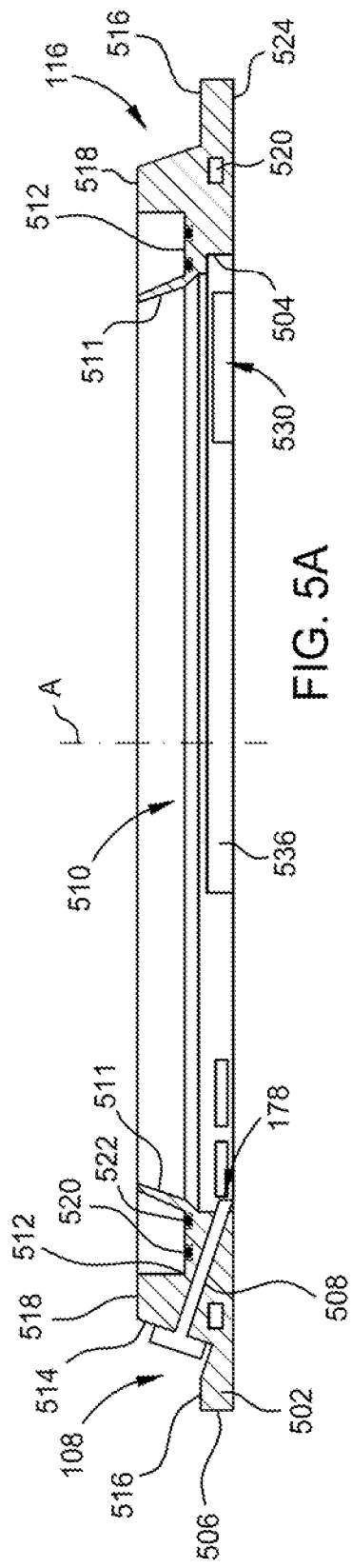
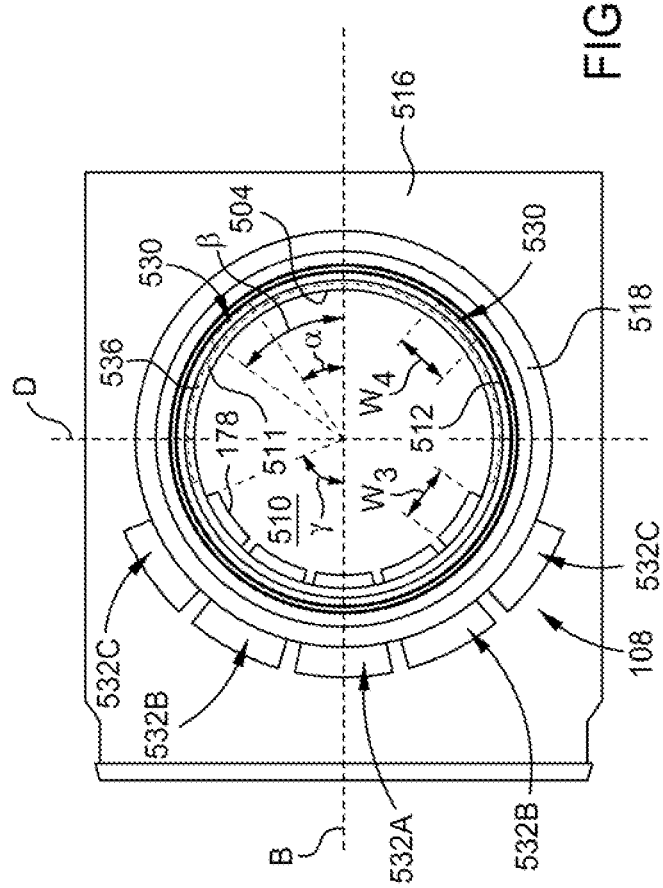

ID FOR EPITAXIALLY DEPOSITING
A MATERIAL ON A SUBSTRATE BY
FLOWING A PROCESS GAS ACROSS THE
SUBSTRATE FROM AN UPPER GAS INLET
TO AN UPPER GAS OUTLET AND
FLOWING A PURGE GAS FROM A LOWER
GAS INLET TO A LOWER GAS OUTLET

BACKGROUND

Field

Embodiments of the present disclosure generally relate to processes and apparatuses for fabricating microelectronic devices, more specifically, to processes and apparatuses relate to epitaxial deposition.

Description of the Related Art

Substrates are processed for a wide variety of applications, including the fabrication of microelectronic devices. During fabrication processing, the substrate is positioned on a susceptor within a process chamber and exposed to deposition and etching processes while forming and removing multiple films on the substrate, respectively, to produce the microelectronic device. However, during processing, variations within process parameters (e.g., temperature, pressure, and processing gas flow) may result in a variation in the thickness of and/or the profile of the film on the substrate, as well as the formation and distribution of contamination throughout the process chamber and on the substrate. The variations in thickness and/or contaminants may result in one or more artifacts within the films and failures within the microelectronic device. The corresponding substrates must be discarded, resulting in decreased production yield and increased manufacturing costs. Also, the accumulation of contaminants throughout the process chamber, especially on the backside of the susceptor, can cause extended downtime for cleaning processes which reduces the overall fabrication efficiency.

Therefore, there needs to be improved epitaxial deposition processes and related epitaxial process chambers for conducting such epitaxial deposition processes.

SUMMARY

Embodiments described herein include processes and apparatuses for fabricating microelectronic devices, more specifically, to processes and apparatuses relate to epitaxial deposition. In one or more embodiments, a method for epitaxially depositing a material on a substrate is provided and includes positioning a substrate on a substrate support surface of a susceptor within a process volume of a chamber body, where the process volume contains an upper chamber region and a lower chamber region, and the substrate support surface is in the upper chamber region and a lower surface of the susceptor is in the lower chamber region during an epitaxy process. The method also includes flowing a process gas containing one or more chemical precursors from an upper gas inlet on a first side of the chamber body, across the substrate, and to an upper gas outlet on a second side of the chamber body during the epitaxy process, flowing a purge gas from a lower gas inlet on the first side of the chamber body, across the lower surface of the susceptor, and to a lower gas outlet on the second side of the chamber body during the epitaxy process, and maintaining a pressure of the lower chamber region greater than a pressure of the upper chamber region during the epitaxy process.

In some embodiments, a method for epitaxially depositing a material on a substrate is provided and includes positioning a substrate on a substrate support surface of a susceptor within a process volume of a chamber body, where the process volume contains an upper chamber region and a lower chamber region, and the substrate support surface is in the upper chamber region and a lower surface of the susceptor is in the lower chamber region during an epitaxy process. The method also includes flowing a process gas containing at least a silicon precursor from an upper gas inlet on a first side of the chamber body, across the substrate, and to an upper gas outlet on a second side of the chamber body during the epitaxy process, flowing a purge gas from a lower gas inlet on the first side of the chamber body, across the lower surface of the susceptor, and to a lower gas outlet on the second side of the chamber body during the epitaxy process, and maintaining a pressure of the lower chamber region at about 1% to about 5% greater than a pressure of the upper chamber region during the epitaxy process. The pressure of the lower chamber region can be maintained greater than the pressure of the upper chamber region by one or more of: increasing an exhaust rate of the process gas through the upper gas outlet, decreasing an exhaust rate of the purge gas through the lower gas outlet, and/or increasing a flow rate of the purge gas through the lower gas inlet.

In other embodiments, a process chamber assembly for processing a substrate is provided and includes a chamber body, a process volume contained within the chamber body, where the process volume has an upper chamber region and a lower chamber region, and a substrate support assembly containing a susceptor having a substrate support surface opposite a lower surface disposed within the process volume, where the substrate support assembly is configured to vertically position the susceptor between a loading position and a processing position within the processing region, and the substrate support surface is in the upper chamber region and the lower surface is in the lower chamber region when the susceptor is in the processing position. The process chamber also includes a first gas system in the upper chamber region which contains an upper gas inlet on a first side of the chamber body and an upper gas outlet on a second side of the chamber body which is opposite of the first side, and a second gas system in the lower chamber region which contains a lower gas inlet on the first side of the chamber body and a lower gas outlet on the second side of the chamber body. The process chamber further includes a gap disposed peripherally and radially around the susceptor, where the gap is disposed between the susceptor and an inner surface of the chamber body, and the upper chamber region and the lower chamber region are in fluid communication with each other through the gap.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 5A is a schematic cross sectional view of an inject ring, according to one or more embodiments described and discussed herein.

FIG. 5B is a schematic plan view of the inject ring of FIG. 5A, according to one or more embodiments described and discussed herein.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments described herein include processes and apparatuses for fabricating microelectronic devices, more specifically, to processes and apparatuses relate to epitaxial deposition. In one or more embodiments, a process volume within a chamber body is partitioned or otherwise separated by a susceptor to form an upper chamber region and a lower chamber region. The upper chamber region and the lower chamber region are in fluid communication with each other. During an epitaxy process, a process gas containing one or more chemical precursors is flowed across the substrate on the top side or upper surface of the susceptor within the upper chamber region while a purge gas is flowed across the backside or lower surface of the susceptor within the lower chamber region. The pressure of the lower chamber region is maintained at a greater value than the pressure of the upper chamber region during the epitaxy process. The pressures of the upper and lower chamber regions are maintained and/or controlled such that the diffusion of the process gas into the lower chamber region and the diffusion of the purge gas into the upper chamber region are both minimized during the epitaxy process. Minimizing the diffusion of the gases between the upper and lower chamber regions is advantageous to provide ideal conditions for epitaxy deposition on the substrate in the upper chamber region while also reducing or prohibiting contaminants in the lower chamber region, especially on the backside of the susceptor.

The process chamber assembly is configured as a thermal deposition chamber, such as an epitaxial deposition chamber. The process chamber disclosed herein enables improved process gas flow and substrate heating. The process chamber has less expensive components compared to conventional chambers, thus reducing the cost for replacement of portions of the process chamber after the portion of the chamber body is worn or when an improved design to a portion of the chamber body is available. The disclosed process chamber overcomes conventional challenges, including improved process gas flow through the chamber volume and more uniform thermal control, which enables better throughput with increased process yields.

Also disclosed herein are components of the process chamber assembly. The components disclosed herein include an inject ring, a base ring, an upper lamp module, a lower lamp module, the susceptor, a rotation assembly, an upper liner, a lower liner, and one or more heating elements. Each of the process chamber components are used together to flow one or more process gases horizontally across the surface of a substrate. The process chamber components are coupled together and form a process volume in which a substrate is processed, for example, by epitaxial deposition.

Figure 1A:
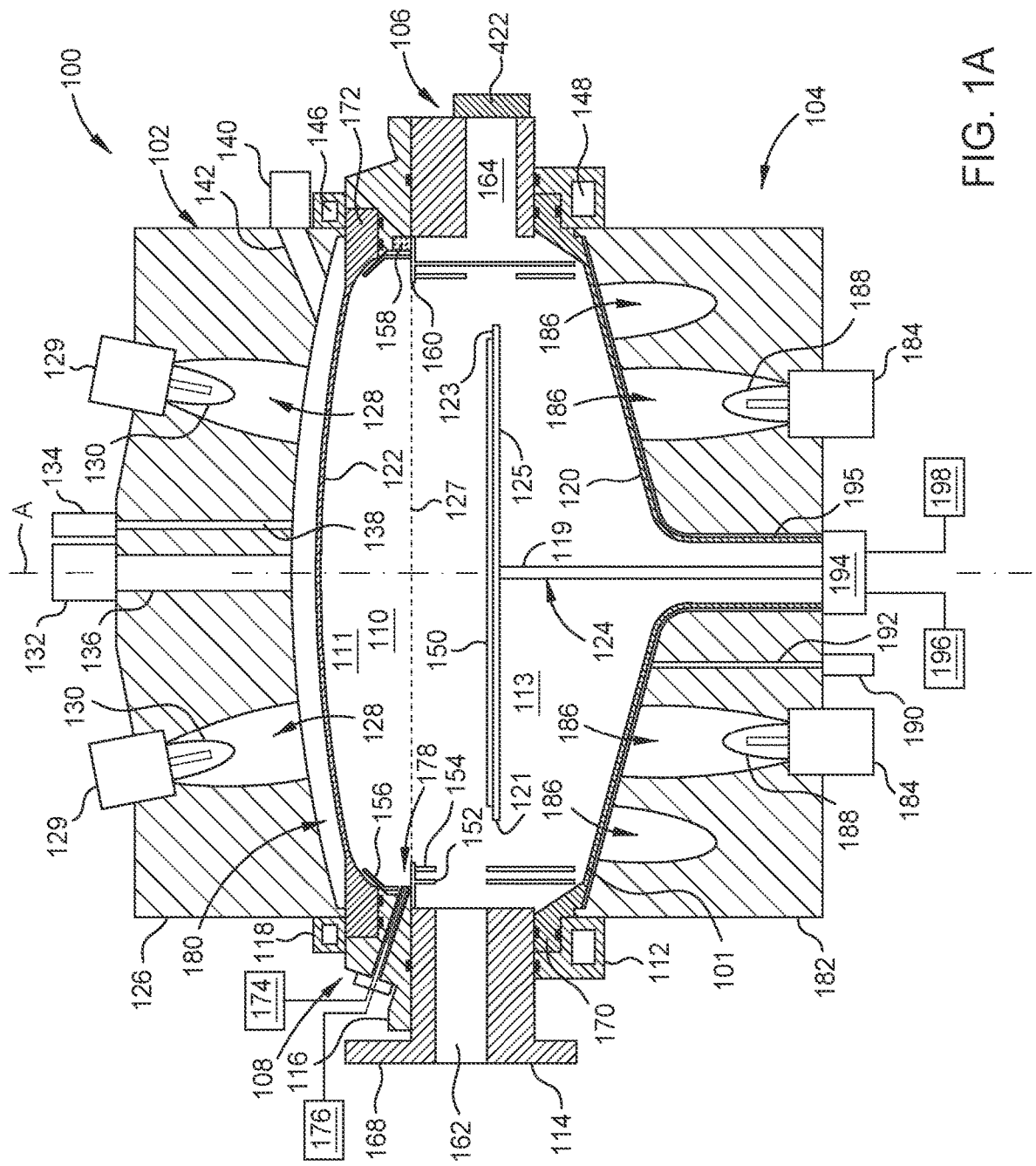
FIG. 1A depicts a schematic illustration of a process chamber assembly having a susceptor in a loading position, according to one or more embodiments described and discussed herein.
Figure 1B:
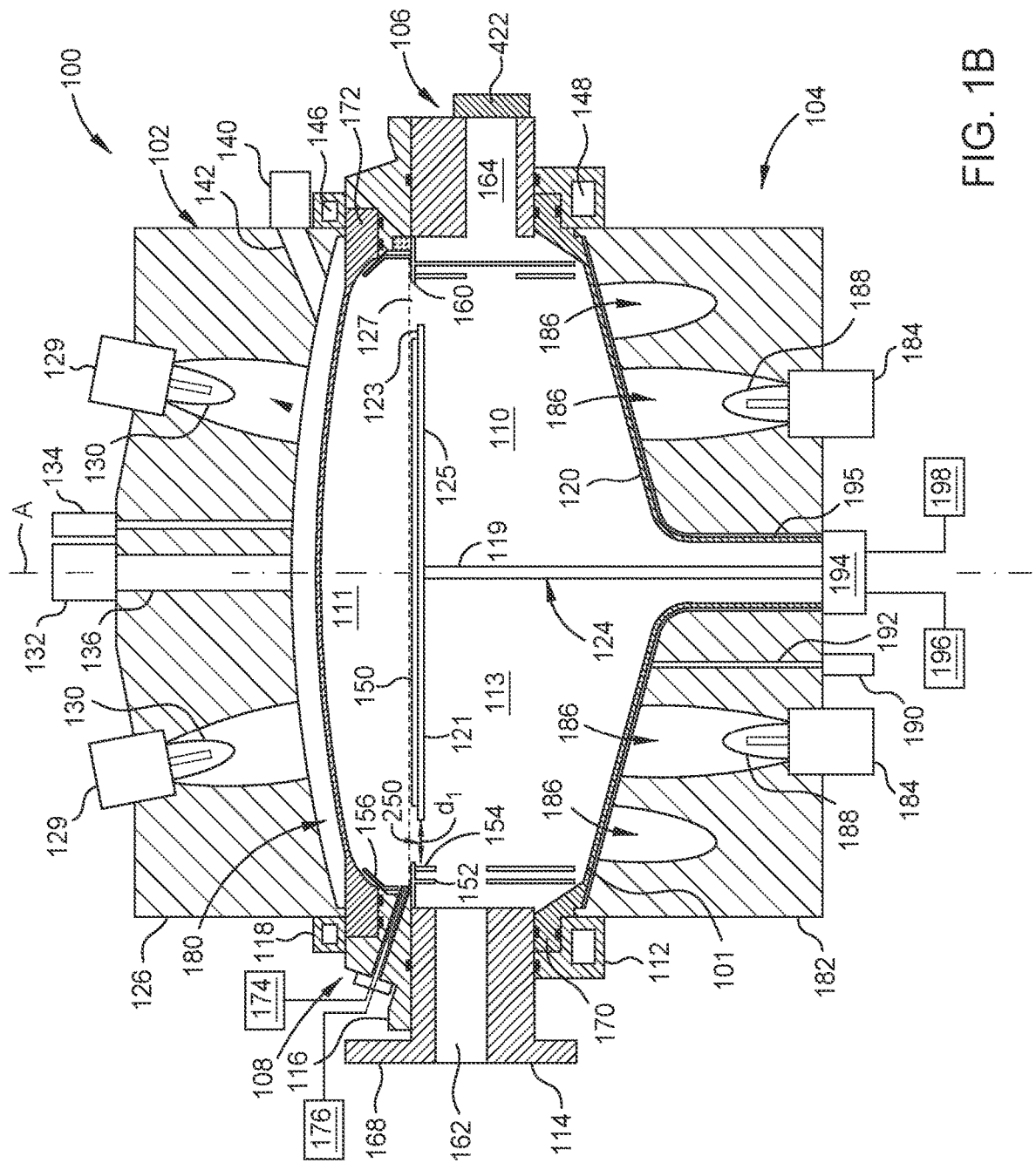
FIG. 1B depicts a schematic illustration of the process chamber assembly illustrated in FIG. 1A with the susceptor in a processing position, according to one or more embodiments described and discussed herein.

FIGS. 1A-1B are schematic illustrations of a process chamber assembly 100, according to one or more embodiments described and discussed herein. FIG. 1A depicts the process chamber assembly 100 having a substrate support or susceptor 121 in a lower or loading position, while FIG. 1B depicts the process chamber assembly 100 with the susceptor 121 in an upper or processing position, according to one or more embodiments described and discussed herein. The process chamber assembly 100 can be an epitaxial deposition chamber and can be used as part of a cluster tool (not shown). The process chamber assembly 100 is utilized to grow epitaxial films and materials on substrates, such as a substrate 150. The process chamber assembly 100 provides a cross-flow of precursors across the top surface of the substrate 150 while providing a cross-flow of purge gas across the backside or lower surface of the susceptor 121 during the epitaxy process or other processes.

The process chamber assembly 100 also includes a chamber body 101 containing a process volume 110 which includes an upper chamber region 111 and a lower chamber region 113. A substrate support assembly 124 at least partially within the chamber body 101 contains the susceptor 121 having a substrate support surface 123 opposite a backside or lower surface 125 disposed within the process volume 110. The substrate support assembly 124 is configured to vertically position the susceptor 121 between a loading position and a processing position within the processing region. When the susceptor 121 is in the processing position, the substrate support surface 123 is in the upper chamber region 111 and the lower surface 125 is in the lower chamber region 113.

The upper chamber region 111 is the portion of the process volume 110 in which the substrate 150 is processed and process gases are injected during the epitaxy process or other processes. The lower chamber region 113 is the portion of the process volume 110 in which the substrate 150 is loaded onto the substrate support assembly 124. The upper chamber region 111 may also be the volume above the susceptor 121 of the substrate support assembly 124 while the substrate support assembly 124 is in the processing position. The lower chamber region 113 is the volume below the susceptor 121 of the substrate support assembly 124 while the substrate support assembly 124 is in the processing position. The processing position (shown in FIGS. 1B and 2) is the position wherein the substrate 150 is disposed even with or above the horizontal plane 127. The horizontal plane 127 is the plane through which the inject ring 116 and the base ring 114 contact one another. A gap 250 (shown in FIGS. 1B and 2) is disposed peripherally and radially around the susceptor 121. The gap 250 is disposed between the susceptor 121 and an inner surface of a sidewall of the chamber body 101.

The process chamber assembly 100 includes an upper lamp module 102, a lower lamp module 104, a chamber body assembly 106, a substrate support assembly 124, a lower window 120, and an upper window 122. The substrate support assembly 124 contains a shaft 119 coupled to the susceptor 121 having a substrate support surface 123. The substrate support assembly 124 is disposed at least in part between the substrate support assembly 124 and the lower lamp module 104. The lower window 120 is disposed between the substrate support assembly 124 and the lower lamp module 104. The upper window 122 is disposed between the substrate support assembly 124 and the upper lamp module 102.

The upper lamp module 102 is disposed over the substrate support assembly 124 and configured to heat a substrate, such as the substrate 150, disposed on the substrate support assembly 124. The upper lamp module 102 includes an upper module body 126 and a plurality of lamp apertures 128 disposed through the upper module body 126. Each of the plurality of lamp apertures 128 includes a lamp 130 disposed therein. Each of the lamps 130 are coupled to a lamp base 129. Each of the lamp bases 129 supports one of the lamps 130 and electrically couples each of the lamps 130 to a power source (not shown). Each of the lamps 129 are secured in a generally vertical orientation within the apertures 128. As described herein, the generally vertical orientation of the lamps 130 is approximately perpendicular to the substrate support surface 123 of the substrate support assembly 124. The vertical orientation of the lamps 130 is not necessarily perpendicular to the substrate support surface 123, but may also be at an angle of about 30 degrees to about 150 degrees with respect to the substrate support surface 123, such as an angle of about 45 degrees to about 135 degrees with respect to the substrate support surface 123, such as an angle of about 70 degrees to about 110 degrees with respect to the substrate support surface 123.

The upper lamp module 102 further includes a heated gas passage 136 and a pyrometer passage 138. A heated gas supply source 132 is fluidly coupled to the heated gas passage 136. The heated gas passage 136 extends from the top surface to the bottom surface of the upper module body 126. The heated gas passage 136 is configured to allow heated gas, such as heated air or a heated inert gas, to flow from the heated gas supply source 132 to the top surface of the upper window 122 to convectively heat the upper window 122. The heated gas is supplied to an upper plenum 180 defined between the upper lamp module 102 and the upper window 122. A heated gas exhaust passage 142 is also disposed through the upper module body 126. The heated gas exhaust passage 142 is coupled to a heated exhaust pump 140. The heated exhaust pump 140 removes gas from the upper plenum 180. The heated exhaust pump 140 may also function as an exhaust pump for the process volume. The heated gas exhaust passage 142, in some embodiments, may be a groove formed along an edge of the upper module body 126 or may be formed through a separate component in fluid communication with the upper plenum 180.

The pyrometer passage 138 is disposed through the upper module body 126 to enable a pyrometer 134, such as a scanning pyrometer, to measure the temperature of the substrate 150. The pyrometer 134 is disposed on top of the upper module body 126 adjacent to the pyrometer passage 138. The pyrometer passage 138 extends from the top surface of the upper module body 126 to the bottom surface adjacent to the upper window 122.

The lower lamp module 104 is disposed below the substrate support assembly 124 and configured to heat a bottom side of the substrate 150 disposed on the substrate support assembly 124. The lower lamp module 104 includes a lower module body 182 and a plurality of lamp apertures 186 disposed through the lower module body 182. Each of the plurality of lamp apertures 186 includes a lamp 188 disposed therein. Each of the lamps 188 are disposed in a generally vertical orientation and coupled to a lamp base 184. Each of the lamp bases 184 supports one of the lamps 188 and electrically coupled each of the lamps 188 to a power source (not shown). As described herein, the generally vertical orientation of the lamps 188 is described with respect to the substrate support surface 123 of the substrate support assembly 124. The generally vertical orientation is not necessarily perpendicular to the substrate support surface 123, but may also be at an angle of about 30 degrees to about 150 degrees with respect to the substrate support surface 123, such as an angle of about 45 degrees to about 135 degrees with respect to the substrate support surface 123, such as an angle of about 70 degrees to about 110 degrees with respect to the substrate support surface 123.

The lower lamp module 104 further includes a susceptor shaft passage 195 and a pyrometer passage 192. The susceptor shaft passage 195 is disposed through the middle of the lower module body 182. The susceptor shaft passage 195 is configured to allow the support shaft 904 of the substrate support assembly 124 and a portion of the lower window 120 to pass through the lower module body 182.

Continuing to refer to FIGS. 1A-1B, the pyrometer passage 192 is disposed through the lower module body 182 to enable a pyrometer 190, such as a scanning pyrometer, to measure the temperature of the bottom surface of the substrate 150 or the bottom surface of the susceptor 121. The pyrometer 190 is disposed below the lower module body 182 adjacent to the pyrometer passage 192. The pyrometer passage 192 is disposed from the bottom surface of the lower module body 182 to the top surface of the lower module body 182 adjacent to the lower window 120.

The chamber body assembly 106 includes an inject ring 116 and a base ring 114. The inject ring 116 is disposed on top of the base ring 114. The inject ring 116 includes one or more gas injectors 108 disposed therethrough. The base ring 114 includes a substrate transfer passage 162, one or more upper chamber exhaust passages 426 (FIGS. 2 and 4E), and a lower chamber exhaust passage 164 disposed therethrough. The substrate transfer passage 162 is disposed opposite the one or more upper chamber exhaust passages 426 and the lower chamber exhaust passage 164. Each of the one or more upper chamber exhaust passages 426 are coupled to an exhaust module 422.

The one or more upper chamber exhaust passages 426 and the lower chamber exhaust passage 164 are coupled to one or more exhaust pumps (not shown). The one or more exhaust pumps are configured to remove exhaust gases from the process volume 110 via the one or more upper chamber exhaust passages 426 and the lower chamber exhaust passage 164. In some embodiments, each of the upper chamber exhaust passages 426 and the lower chamber exhaust passage 164 are coupled to a single exhaust pump using a plurality of conduits. In other embodiments, the upper chamber exhaust passages 426 are coupled to a different exhaust pump than the lower chamber exhaust passage 164.

The substrate transfer passage 162 is formed through the base ring 114 and is configured to allow a substrate to pass therethrough from a transfer chamber of a cluster tool (not shown). A flange 168 is attached to one end of the base ring 114 to enable the attachment of the process chamber assembly 100 to a cluster tool (not shown). The substrate transfer passage 162 passes through the flange 168.

An upper cooling ring 118 and a lower cooling ring 112 are disposed on opposite sides of the chamber body assembly 106. The upper cooling ring 118 is disposed on top of the inject ring 116. In one or more embodiments, the upper cooling ring 118 is configured to cool a clamp ring (not shown) which clamps or otherwise holds a flange portion of a dome (e.g., the lower window 120) to the chamber body 101 for the purpose of vacuum sealing. In other embodiments, the upper cooling ring 118 is configured to cool the inject ring 116. The lower cooling ring 112 is disposed below the base ring 114 and is configured to cool the base ring 114. The upper cooling ring 118 includes a coolant passage 146 disposed therethrough. The coolant which is circulated through the coolant passage 146 may include water or oil in some embodiments. The lower cooling ring 112 includes a coolant passage 148 disposed therethrough. The coolant which is circulated through the coolant passage 148 is similar to the coolant circulated through the coolant passage 146 of the upper cooling ring 118. In some embodiments, the upper cooling ring 118 and the lower cooling ring 112 assist in securing the inject ring 116 and the base ring 114 in place. The upper cooling ring 118 may partially support the upper lamp module 102 while the lower cooling ring 112 may partially support the base ring 114 and the inject ring 116.

The use of the upper cooling ring 118 and the lower cooling ring 112 reduces the temperature of the inject ring 116 and the base ring 114 without the need for additional cooling channels being disposed through the inject ring 116 and the base ring 114 as present in conventional rings. This reduces the cost of the production of the inject ring 116 and the base ring 114, which are more frequently replaced than the upper cooling ring 118 and the lower cooling ring 112. In some embodiments, the inject ring 116 may have an additional coolant passage 521 (FIG. 5A) disposed therethrough.

The one or more gas injectors 108 of the inject ring 116 are disposed through one or more openings within the inject ring 116. In embodiments described herein, there are a plurality of gas injectors 108 disposed through the inject ring 116. The one or more gas injectors 108 are configured to supply process gases to a process volume 110 via one or more gas outlets 178. A single one of the one or more gas injectors 108 is shown in FIGS. 1A-1B. The gas injector 108 is shown as being disposed so the one or more gas outlets 178 are pointed downward toward the substrate support assembly 124 and the substrate 150. The downward angle of the gas injector 108 may be an angle of greater than or about 5 degrees from the horizontal, such as greater than or about 10 degrees from the horizontal. Each of the one or more gas outlets 178 are fluidly coupled to one or more process gas supply sources, such as the first process gas supply source 174 or the second process gas supply source 176. In some embodiments, only a first process gas supply source 174 is utilized. In other embodiments, both the first process gas supply source 174 and the second process gas supply source 176 are utilized and there are two gas outlets 178 within each gas injector 108. The two gas outlets 178 are disposed in a stacked fashion and enable mixing of the gases only after the gases enter the process volume 110. In some embodiments, the first process gas supply source 174 is a process gas while the second process gas supply source 176 is a cleaning gas. In other embodiments, both the first process gas supply source 174 and the second process gas supply source 176 are process gases.

The upper window 122 is disposed between the inject ring 116 and the upper lamp module 102. The upper window 122 is an optically transparent window, such that radiant energy produced by the upper lamp module 102 may pass therethrough. In some embodiments, the upper window 122 is formed of a quartz or a glass material. The upper window 122 is a dome shape and in some embodiments is described as an upper dome. The outer edges of the upper window 122 form peripheral supports 172. The peripheral supports 172 are thicker than the central portion of the upper window 122. The peripheral supports 172 are disposed on top of the inject ring 116. The peripheral supports 172 connect to the central portion of the upper window 122 and are formed of the optically transparent material of the central portion of the upper window 122.

The lower window 120 is disposed between the base ring 114 and the lower lamp module 104. The lower window 120 is an optically transparent window, such that radiant energy produced by the lower lamp module 104 may pass therethrough. In some embodiments, the lower window 120 is formed of a quartz or a glass material. The lower window 120 is a dome shape and in some embodiments is described as a lower dome. The outer edges of the lower window 120 form peripheral supports 170. The peripheral supports 170 are thicker than the central portion of the lower window 120. The peripheral supports 170 connect to the central portion of the lower window 120 and are formed of the same optically transparent material.

A variety of liners and heaters are disposed inside of the chamber body assembly 106 and within the process volume 110. As shown in FIGS. 1A and 1B, there is an upper liner 156 and a lower liner 154 disposed within the chamber body assembly 106. The upper liner 156 is disposed above the lower liner 154 and inward of the inject ring 116. The lower liner 154 is disposed inward of the base ring 114. The upper liner 156 and the lower liner 154 are configured to be coupled together while in the process volume. The upper liner 156 and the lower liner 154 are configured to shield the inner surfaces of the inject ring 116 and the base ring 114 from the process gases within the process volume. The upper liner 156 and the lower liner 154 further serve to reduce heat loss from the process volume to the inject ring 116 and the base ring 114. Reduced heat loss improves heating uniformity of the substrate 150 and enables more uniform deposition on the substrate 150 during the epitaxy process or other processes.

An upper heater 158 and a lower heater 152 are also disposed within the chamber body assembly 106 and the process volume 110. As shown in FIGS. 1A-1B, the upper heater 158 is disposed between the upper liner 156 and the inject ring 116 while the lower heater 152 is disposed between the lower liner 154 and the base ring 114. Both of the upper heater 158 and the lower heater 152 are disposed inward of the chamber body assembly 106 to enable more uniform heating of the substrate 150 while the substrate 150 is within the process chamber assembly 100. The upper heater 158 and the lower heater 152 reduce heat loss to the walls of the chamber body assembly 106 and create a more uniform temperature distribution around the surfaces forming the process volume 110. Each of the upper liner 156, the lower liner 154, the upper heater 158, and the lower heater 152 are coupled to a flange 160 disposed within the process volume 110. The flange 160 is a horizontal surface configured to be secured between a portion of the inject ring 116 and the base ring 114 to enable securing of each of the upper liner 156, the lower liner 154, the upper heater 158, and the lower heater 152. In embodiments described herein, both the upper heater 158 and the lower heater 152 may be configured to have a heated fluid run therethrough or may be resistive heaters. The upper heater 158 and the lower heater 152 are further shaped to accommodate openings through the inject ring 116 and the base ring 114.

The substrate support assembly 124 is disposed within the process volume 110 and is configured to support the substrate 150 during the epitaxy process or other processes. The substrate support assembly 124 includes a planar upper surface for supporting the substrate 150 and the shaft 119 which extends through a portion of the lower window 120 and the lower lamp module 104. The substrate support assembly 124 is coupled to a movement assembly 194 via the shaft 119. The movement assembly 194 includes a rotation assembly 196 and a lift assembly 198. The rotation assembly 196 is configured to rotate of the substrate support assembly 124 about a central axis A, while the lift assembly 198 is configured to move the substrate support assembly 124 linearly within the process volume 110 along the central axis A.

Figure 2A:
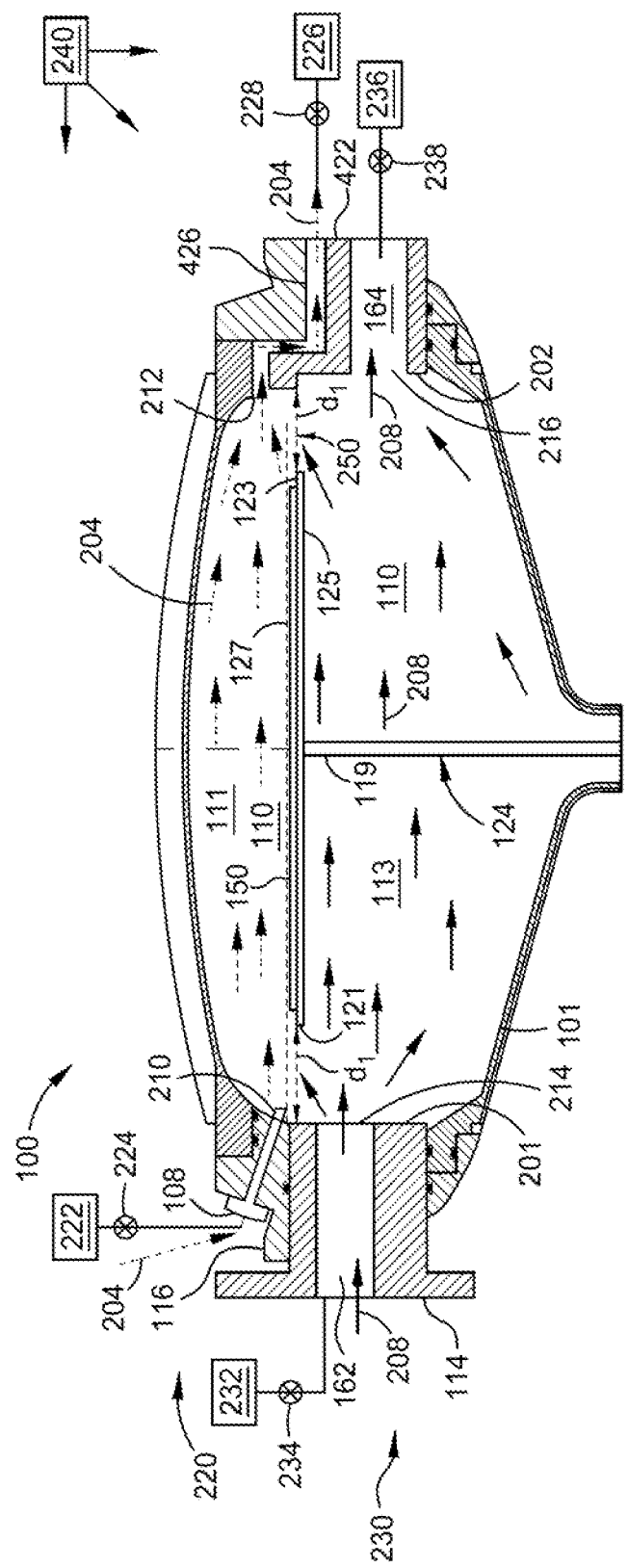
FIG. 2A depicts a schematic illustration of gaseous flow paths within upper and lower chamber regions of a process chamber, according to one or more embodiments described and discussed herein.

FIG. 2A depicts a schematic illustration of gaseous flow paths within the upper and lower chamber regions 111, 113 of the process volume 110 within the process chamber assembly 100, according to one or more embodiments described and discussed herein. The process chamber assembly 100 includes a first gas system 220 in the upper chamber region 111 and a second gas system 230 in the lower chamber region 113. The first gas system 220 contains an upper gas inlet 210 on a first side 201 of the chamber body 101 and an upper gas outlet 212 on a second side 202 of the chamber body 101 which is opposite of the first side 201. The second gas system 230 contains a lower gas inlet 214 on the first side 201 of the chamber body 101 and a lower gas outlet 216 on the second side 202 of the chamber body 101.

The process chamber assembly 100 further includes a gap 250 disposed peripherally and radially around the susceptor 121, as depicted in FIGS. 1B and 2A-2C. The gap 250 is between the upper chamber region 111 and the lower chamber region 113 which are in fluid communication with each other through the gap 250. The gap 250 is disposed between the susceptor 121 and one or more inner surfaces of or within the chamber body 101. In some embodiments, the gap 250 is disposed between the susceptor 121 and the lower liner 154, as shown in FIG. 1B. In other embodiments, the gap 250 is disposed between the susceptor 121 and the nearest inner surface of the chamber body 101, as shown in FIG. 2A.

Figure 2B:
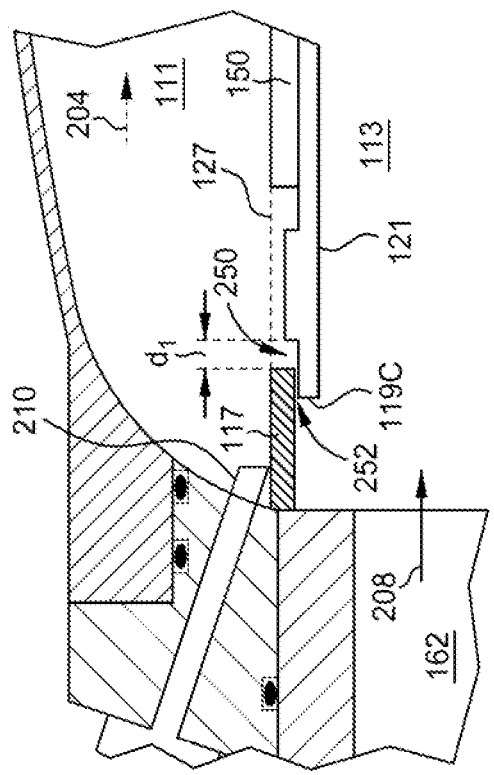
FIGS. 2B and 2C depicts schematic illustrations of different gaps disposed between the upper and lower chamber regions of the process chamber, according to one or more embodiments described and discussed herein.
Figure 2C:
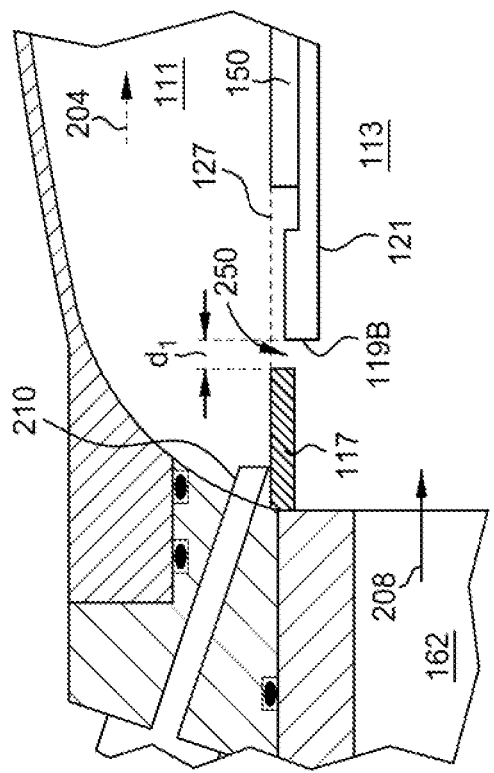

In one or more embodiments, the gap 250 is disposed between the susceptor 121 and a pre-heat ring (PHR) 117, as shown in FIGS. 2B and 2C. As depicted in FIG. 2B, the gap 250 is disposed between an outer edge surface 119B of the susceptor 121 and the PHR 117. As depicted in FIG. 2C, the susceptor 121 contains a protruding segment 119C which is radially outwardly extending and overlapping underneath the PHR 117. The overlap between the protruding segment 119C and the PHR 117 provides a gap 252, which is in fluid communication with the gap 250. The combination of the gaps 250 and 252 are in fluid communication to and between the upper chamber region 111 and the lower chamber region 113, and provides reduced conductance of gases between the upper chamber region 111 and the lower chamber region 113.

The gap 250 provides space for the susceptor 121 while rotating about the chamber body 101 and/or the PHR 117 which are stationary. In one or more embodiments, the PHR 117 is made from or otherwise contains one or more materials which absorb radiation heat (e.g., from lamps) and serves as a pre-heating mechanism for the process gas 204 that enter the upper chamber region 111 form the injector 210. The process gas 204 can be heated to an elevated and desired temperature prior to being delivered to the substrate 150. Exemplary materials for the PHR 117 can be or include graphite, silicon carbide, quartz, silicon carbide coated graphite, or any combination thereof.

The distance ($d_1$) from the edge of the susceptor 121 to the lower liner 154, the chamber body 101, the PHR 117, or other inner surface is the width of the gap 250. The gap 252 can independently have the same or smaller width as the gap 250. The distance ($d_1$), the width of the gap 250, or the width of the gap 252 can independently be from about 0 mm (no gap), about 0.1 mm, about 0.5 mm, about 1 mm, about 1.5 mm, about 2 mm, about 3 mm, or about 4 mm to about 5 mm, about 6 mm, about 7 mm, about 8 mm, about 9 mm, about 10 mm, or about 12 mm. For example, the distance ($d_1$) or the width of the gap 250 can be about 0.1 mm to about 12 mm, about 0.1 mm to about 10 mm, about 0.1 mm to about 8 mm, about 0.1 mm to about 6 mm, about 0.1 mm to about 5 mm, about 0.1 mm to about 4 mm, about 0.1 mm to about 3 mm, about 0.1 mm to about 2 mm, about 0.1 mm to about 1 mm, about 1 mm to about 12 mm, about 1 mm to about 10 mm, about 1 mm to about 8 mm, about 1 mm to about 6 mm, about 1 mm to about 5 mm, about 1 mm to about 4 mm, about 1 mm to about 3 mm, about 1 mm to about 2 mm, about 1 mm to about 1.5 mm, about 2 mm to about 12 mm, about 2 mm to about 10 mm, about 2 mm to about 8 mm, about 2 mm to about 6 mm, about 2 mm to about 5 mm, about 2 mm to about 4 mm, or about 2 mm to about 3 mm.

In one or more embodiments, a method for epitaxially depositing a material (e.g., silicon, germanium, silicon-germanium) on the substrate 150 is provided and includes positioning the substrate 150 on the substrate support surface 123 of the susceptor 121 within the process volume 110 of the chamber body 101 during the epitaxy process or other process. The substrate support surface 123 is in the upper chamber region 111 and the lower surface 125 of the susceptor 121 is in the lower chamber region 113 during the epitaxy process, as depicted in FIGS. 1B and 2. One or more process gases 204 (indicated by dashed arrows) is flowed from one or more upper gas inlets 210 fluidly coupled to the gas injectors 108 on the first side 201 of the chamber body 101, across the substrate 150, and to one or more upper gas outlets 212 fluidly coupled to the upper chamber exhaust passage 426 on a second side 202 of the chamber body 101 during the epitaxy process. Each process gas can be or contain one or more chemical precursors, such as a silicon precursor, a germanium precursor, a carbon precursor, a dopant precursor, one or more carrier gases, or any combination thereof. For example, the silicon precursor can be or contain silane, disilane, trisilane, or higher order silanes (HOS) such as tetrasilane, neopentasilane, chlorosilane, dichlorosilane (DCS), tetrachlorosilane (TCS), hexachlorodisilane, or any combination thereof. The carrier gas can be or contain nitrogen gas ($N_2$), argon, helium, hydrogen ($H_2$), or any combination thereof.

One or more purge gases 208 (indicated by arrows) is flowed from one or more lower gas inlets 214 fluidly coupled to the substrate transfer passage 162 on the first side 201 of the chamber body 101, across the lower surface 125 of the susceptor 121, and to one or more lower gas outlets 216 fluidly coupled to the lower chamber exhaust passage 164 on the second side 202 of the chamber body 101 during the epitaxy process. The purge gas 208 can be or contain nitrogen gas ($N_2$), argon, helium, hydrogen ($H_2$), or any combination thereof.

In one or more embodiments, the process gas 204 in the upper chamber region 111 and the purge gas 208 in the lower chamber region 113 are simultaneously flowing during the epitaxy process. The pressure of the lower chamber region 113 is maintained and/or controlled to be greater than a pressure of the upper chamber region 111 during the epitaxy process. The pressure of the lower chamber region 113 is maintained about 0.5%, about 0.8%, about 1%, about 1.5%, about 2%, or about 2.5% to about 3%, about 4%, about 5%, about 6%, about 7%, about 8%, about 9%, or about 10% greater than the pressure of the upper chamber region 111. For example, the pressure of the lower chamber region 113 is maintained about 0.5% to about 10%, about 0.5% to about 8%, about 0.5% to about 6%, about 0.5% to about 5%, about 0.5% to about 4%, about 0.5% to about 3%, about 0.5% to about 2%, or about 0.5% to about 1% greater than the pressure of the upper chamber region 111. In other examples, the pressure of the lower chamber region 113 is maintained about 1% to about 5%, about 1% to about 4%, about 1% to about 3%, or about 1% to about 2% greater than the pressure of the upper chamber region 111.

Each of the pressure of the upper chamber region 111 and the pressure of the lower chamber region 113 can independently be at about 1 Torr, about 3 Torr, about 5 Torr, about 6 Torr, about 7 Torr, about 8 Torr, about 9 Torr, or about 10 Torr to about 12 Torr, about 14 Torr, about 15 Torr, about 18 Torr, about 20 Torr, about 22 Torr, about 25 Torr, about 28 Torr, or about 30 Torr. For example, each of the pressure of the upper chamber region 111 and the pressure of the lower chamber region 113 can independently be at about 1 Torr to about 30 Torr, about 2 Torr to about 30 Torr, about 5 Torr to about 30 Torr, about 5 Torr to about 25 Torr, about 5 Torr to about 20 Torr, about 5 Torr to about 18 Torr, about 5 Torr to about 15 Torr, about 5 Torr to about 12 Torr, about 5 Torr to about 10 Torr, about 5 Torr to about 8 Torr, about 10 Torr to about 25 Torr, about 10 Torr to about 20 Torr, about 10 Torr to about 18 Torr, about 10 Torr to about 15 Torr, or about 10 Torr to about 12 Torr.

In other embodiments, each of the pressure of the upper chamber region 111 and the pressure of the lower chamber region 113 can independently have other pressures including at atmospheric (about 760 Torr) and greater. In some examples, the methods described and discussed herein can be utilized during an atmospheric epitaxy process in which the lower chamber region 113 is maintained at a higher pressure than the upper chamber region 111. In such embodiments, each of the pressure of the upper chamber region 111 and the pressure of the lower chamber region 113 can independently be at about 10 Torr, about 20 Torr, about 50 Torr, about 80 Torr, about 100 Torr, about 120 Torr, or about 150 Torr to about 200 Torr, about 250 Torr, about 300 Torr, about 400 Torr, about 500 Torr, about 600 Torr, about 700 Torr, about 720 Torr, about 750 Torr, about 760 Torr, about 770 Torr, about 780 Torr, or greater. For example, each of the pressure of the upper chamber region 111 and the pressure of the lower chamber region 113 can independently be at about 50 Torr to about 780 Torr, about 100 Torr to about 780 Torr, about 150 Torr to about 780 Torr, about 200 Torr to about 780 Torr, about 300 Torr to about 780 Torr, about 400 Torr to about 780 Torr, about 500 Torr to about 780 Torr, about 600 Torr to about 780 Torr, about 700 Torr to about 780 Torr, about 50 Torr to about 760 Torr, about 100 Torr to about 760 Torr, about 150 Torr to about 760 Torr, about 200 Torr to about 760 Torr, about 300 Torr to about 760 Torr, about 400 Torr to about 760 Torr, about 500 Torr to about 760 Torr, about 600 Torr to about 760 Torr, about 700 Torr to about 760 Torr, about 50 Torr to about 740 Torr, about 100 Torr to about 740 Torr, about 150 Torr to about 740 Torr, about 200 Torr to about 740 Torr, about 300 Torr to about 740 Torr, about 400 Torr to about 740 Torr, about 500 Torr to about 740 Torr, about 600 Torr to about 740 Torr, or about 700 Torr to about 740 Torr.

In some embodiments, a clean process is conducted within the process chamber 100 after the deposition or epitaxial process. The clean process can include exposing the interior surfaces of the upper chamber region 111 and/or the lower chamber region 113 to one or more etchant gases or clean gases. The etchant gases or clean gases can be or include hydrogen chloride (HCl), chlorine ($Cl_2$), fluorine ($F_2$), nitrogen fluoride ($NF_3$), one or more carrier gases (e.g., nitrogen, argon, or helium), or any combination thereof. During the clean process, the etchant gases can be flowed from the upper chamber region 111 into the lower chamber region 113 for cleaning or removing any contaminants therein. The methods described and discussed herein can be used to tune pressure and flow of etchants during the clean process in the interior surfaces of the upper chamber region 111 and/or the lower chamber region 113.

In one or more embodiments, the pressure of the lower chamber region 113 is maintained at a value greater than the pressure of the upper chamber region 111 by increasing an exhaust rate of the process gas 204 through the upper gas outlet 212 during the epitaxy process. In other embodiments, the pressure of the lower chamber region 113 is maintained at a value greater than the pressure of the upper chamber region 111 by decreasing an exhaust rate of the purge gas 208 through the lower gas outlet 216 during the epitaxy process. In some embodiments, the pressure of the lower chamber region 113 is maintained at a value greater than the pressure of the upper chamber region 111 by increasing a flow rate of the purge gas 208 through the lower gas inlet 214 during the epitaxy process. By maintaining a pressure of greater value in the lower chamber region 113 than the pressure of the upper chamber region 111, the diffusion of the gases between the upper chamber region 111 and the lower chamber region 113 is minimized, reduced, or eliminated. This minimization, reduction, and/or eliminated of the diffusion of the gases between the upper chamber region 111 and the lower chamber region 113 is advantageous by providing controlled and ideal conditions for epitaxy deposition on the substrate 150 in the upper chamber region 111 while also reducing or prohibiting contaminants in the lower chamber region 113, especially on the backside or lower surface 125 of the susceptor 121.

Continuing to refer to FIG. 2A, the process chamber assembly 100 contains a control unit 240 for controlling and/or maintaining the pressure in the upper chamber region 111 and the lower chamber region 113. The control unit 240 can be configured to independently maintain each of the pressures of the lower chamber region 113 and the upper chamber region 111 at a specified or desired pressure. For example, the control unit 240 can be configured to maintain a pressure of the lower chamber region 113 greater than a pressure of the upper chamber region 111.

In some embodiments, the process chamber assembly 100 contains gas sources 222 and 232 and exhaust or pump sources 226 and 236. Each of the gas sources 222 and 232 can independently be any other gas source described and discussed herein. For example, the gas source 222 can be or include the first process gas supply source 174, the second process gas supply source 176, and/or other gas sources. The gas source 232 can be or include the gases flowing or otherwise being introduced into the substrate transfer passage 162. The gas source 222 supplies one or more of the process gases 204 into the upper chamber region 111 and the gas source 232 supplies one or more of the purge gases 208 into the lower chamber region 113.

Each of the exhaust or pump sources 226 and 236 can independently be any other exhaust or pump source described and discussed herein. For example, the pump source 226 can be fluidly coupled to the upper gas outlet 212, the upper chamber exhaust passage 426, the exhaust module passage 428, the exhaust outlet 430, and/or other exhaust outlets. The pump source 236 can be fluidly coupled to the lower gas outlet 216, the lower chamber exhaust passage 164, and/or other exhaust outlets. The pump source 226 removes the process gases 204 from the upper chamber region 111 and the pump source 236 removes the purge gases 208 from the lower chamber region 113.

Flow control devices 224 and 228, such as valves (e.g., variable conductance valve), flow restrictors, and other devices for controlling the gas flow, can be used to control the flow rate or movement of the process gas 204 within the upper or first gas system 220. One or more flow control devices 224 can control the introduction and flow rate of the process gas 204 from the gas source 222, through the gas injectors 108 and the upper gas inlets 210 and into the upper chamber region 111. One or more flow control devices 228 can control the removal and flow rate of the process gas 204 from the upper chamber region 111, through the upper gas outlet 212, the upper chamber exhaust passage 426, the exhaust module passage 428, the exhaust outlet 430, and into the exhaust or pump sources 226. In one or more examples, the flow control device 228 is or contains one or more flow restrictors, such as a conduit with a reduced diameter downstream from the upper chamber region 111. In some configurations, the control unit 240 can be used to control or otherwise operate the flow control devices 224 and/or 228.

Flow control devices 234 and 238, such as valves (e.g., variable conductance valve), flow restrictors, and other devices for controlling the gas flow, can be used to control the flow rate or movement of the purge gas 208 within the lower or second gas system 230. One or more flow control devices 234 can control the introduction and flow rate of the purge gas 208 from the gas source 232, through the substrate transfer passage 162 and the lower gas inlets 214 and into the lower chamber region 113. One or more flow control devices 238 can control the removal and flow rate of the purge gas 208 from the lower chamber region 113, through the lower gas outlet 216, the lower chamber exhaust passage 164, and into the exhaust or pump sources 236. In one or more examples, the flow control device 238 is or contains one or more flow restrictors, such as a conduit with a reduced diameter downstream from the lower chamber region 113. In some configurations, the control unit 240 can be used to control or otherwise operate the flow control devices 234 and/or 238.

In one or more examples, a method for epitaxially depositing a material on the substrate 150 is provided and includes flowing the process gas 204 containing at least a silicon precursor from the upper gas inlet 210 on the first side 201 of the chamber body 101, across the substrate 150, and to the upper gas outlet 212 on the second side 202 of the chamber body 101, while also flowing the purge gas 208 from the lower gas inlet 214 on the first side 201 of the chamber body 101, across the lower surface 125 of the susceptor 121, and to the lower gas outlet 216 on the second side 202 of the chamber body 101 during the epitaxy process. The method further includes maintaining the pressure of the lower chamber region 113 at about 1% to about 5% having a value greater than the pressure of the upper chamber region 111 during the epitaxy process. The pressure of the lower chamber region 113 can be maintained at or adjusted or controlled to be greater than the pressure of the upper chamber region 111 by one or more of: increasing an exhaust rate of the process gas 204 through the upper gas outlet 212, decreasing an exhaust rate of the purge gas 208 through the lower gas outlet 216, and/or increasing a flow rate of the purge gas 208 through the lower gas inlet 214.

In one or more embodiments, the process chamber assembly 100 contains the upper lamp module 102 and the lower lamp module 104, and the susceptor 121 is disposed between the upper lamp module 102 and the lower lamp module 104. The process chamber assembly 100 contains the upper window 122 disposed between the upper lamp module 102 and the susceptor 121, and the lower window 120 disposed between the lower lamp module 104 and the susceptor 121. The process chamber assembly 100 also includes the base ring 114 disposed between the upper lamp module 102 and the lower lamp module 104. The base ring 114 contains a base ring body having an inner base ring surface and an outer base ring surface, a substrate transfer passage 208 disposed through the inner base ring surface and the outer base ring surface, a lower chamber exhaust passage 164 disposed opposite the substrate transfer passage 208 and through the inner surface and the outer surface, and one or more upper chamber exhaust passages 426. In some configurations, the substrate transfer passage 208 contains the lower gas inlet 214 on the first side 201 of the chamber body 101, and the lower chamber exhaust passage 164 contains the lower gas outlet 216 on the second side 202 of the chamber body 101.

In some embodiments, the process chamber assembly 100 also includes the inject ring 116 disposed on top of the base ring 114 and between the upper lamp module 102 and the lower lamp module 104. The inject ring 116 contains the inject ring body 502 having an inner inject ring surface and an outer inject ring surface, and one or more injector passages 108 disposed between the inner inject ring surface and the outer inject ring surface and above the substrate transfer passage 208. The one or more injector passages 108 contain the upper gas inlet 210 on the first side 201 of the chamber body 101, and the one or more upper chamber exhaust passages 426 contain the upper gas outlet 212 on the second side 202 of the chamber body 101.

Figure 3:
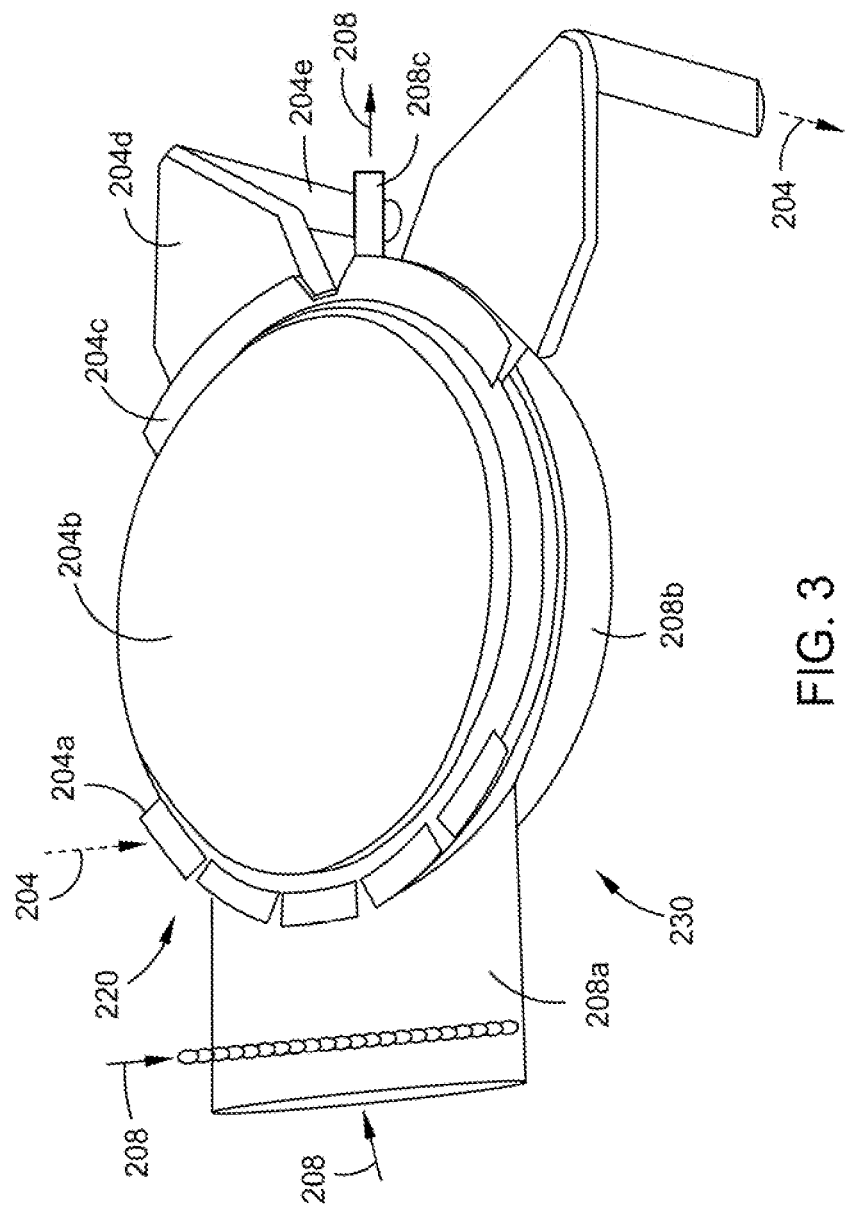
FIG. 3 depicts a schematic illustration of gaseous flow paths within upper and lower chamber regions of a process chamber, according to one or more embodiments described and discussed herein.

FIG. 3 depicts a schematic illustration of gaseous flow paths within upper chamber region 111 and the lower chamber region 113 of the process volume 110 within the process chamber assembly 100, according to one or more embodiments described and discussed herein. FIG. 3 depicts the process gas 204 and the purge gas 208 throughout the process chamber assembly 100 without illustrating the actual components of the process chamber assembly 100. See FIGS. 1A-2 and 4A-5B for specific components of the process chamber assembly 100. The process gas 204 is labeled as process gases 204a-204e in different portions or segments of the first gas system 220 and the purge gas 208 is labeled as purge gases 208a-208c in different portions or segments of the second gas system 230. The process gases 204a-204e take on the geometric shape of the inner space within the first gas system 220 and the purge gases 208a-208c take on the geometric shape of the inner space within the second gas system 230.

In one or more examples, the process gas 204 is contained within: one or more the gas injectors 108 as process gas 204a; the upper chamber region 111 as process gas 204b; the upper chamber exhaust passage 426 as process gas 204c; the exhaust module passage 428 as process gas 204d; and the exhaust outlet 430 as process gas 204e. In other examples, the purge gas 208 is contained within: the substrate transfer passage 162 and/or the injectors (not shown) disposed on and into the substrate transfer passage 162 and/or other parts of the chamber body 101 as purge gas 208a; the lower chamber region 113 as purge gas 208b; and the lower chamber exhaust passage 164 as purge gas 208c.

Figure 4A:
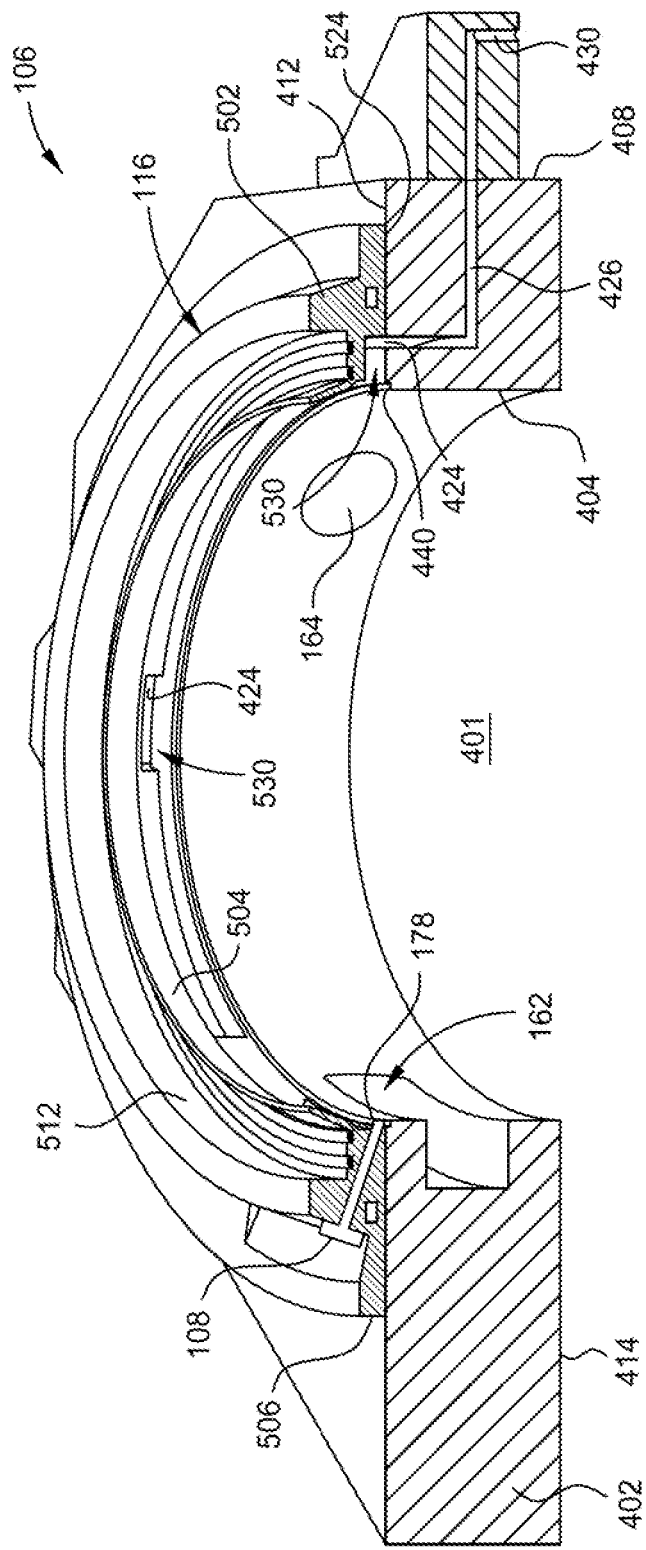
FIG. 4A is a schematic cross sectional perspective view of a chamber body assembly, according to one or more embodiments described and discussed herein.

FIG. 4A is a schematic cross sectional perspective view of the chamber body assembly 106, according to one or more embodiments described and discussed herein. The chamber body 106 includes the inject ring 116 disposed on top of and coupled to the base ring 114. The inject ring 116 includes the one or more gas injectors 108. The inject ring 116 includes an inner surface 504 and the base ring 114 includes an inner surface 404. The inner surfaces 404, 504 of both the base ring 114 and the inject ring 116 are aligned with one another, such that the inner surfaces 404, 504 have the same diameter for at least a portion of the circumference of the base ring 114 and the inject ring 116. The inner surfaces 404, 504 of the base ring 114 and the inject ring 116 form a central opening 401. The central opening 401 includes both an opening 410 of the base ring 114 and an opening 510 of the inject ring 116. A top surface 412 of the base ring 114 is in contact with a bottom surface 524 of the inject ring 116.

One or more gas injectors 108 are disposed on one side of the chamber body assembly 106, while one or more upper chamber exhaust passage openings 424 are disposed on an opposite side of the chamber body assembly 106. Each of the one or more upper chamber exhaust passage openings 424 are aligned with an indent 530 formed in the inner surface of the inject ring 116. The alignment of each of the one or more indents 530 and the upper chamber exhaust passage openings 424 enables gas which is injected by the one or more gas injectors 108 to flow across the process volume 110 (FIGS. 1A-1B) and over the substrate 150 before being removed from the process volume 110 via the upper chamber exhaust passage openings 424. The indents 530 assist in collecting the exhaust gases and directing the exhaust gases downward from an area even with the inject ring 116 towards the upper chamber exhaust passage openings 424. Once the exhaust gas enters the upper chamber exhaust passage openings 424, the exhaust gas flows through one or more upper chamber exhaust passages 426 and out an exhaust outlet 430.

The combination of the indents 530 and the upper chamber exhaust passage openings 424 reduces the complexity of manufacturing the base ring 114 and/or the inject ring 116. The combination of the indents 530 and the upper chamber exhaust passage openings 424 further enables process gas to flow horizontally across the process volume 110 and remain in the upper chamber region 111 without diverting downward into the lower chamber region 113 where it may become a source of contamination.

Figure 4B:
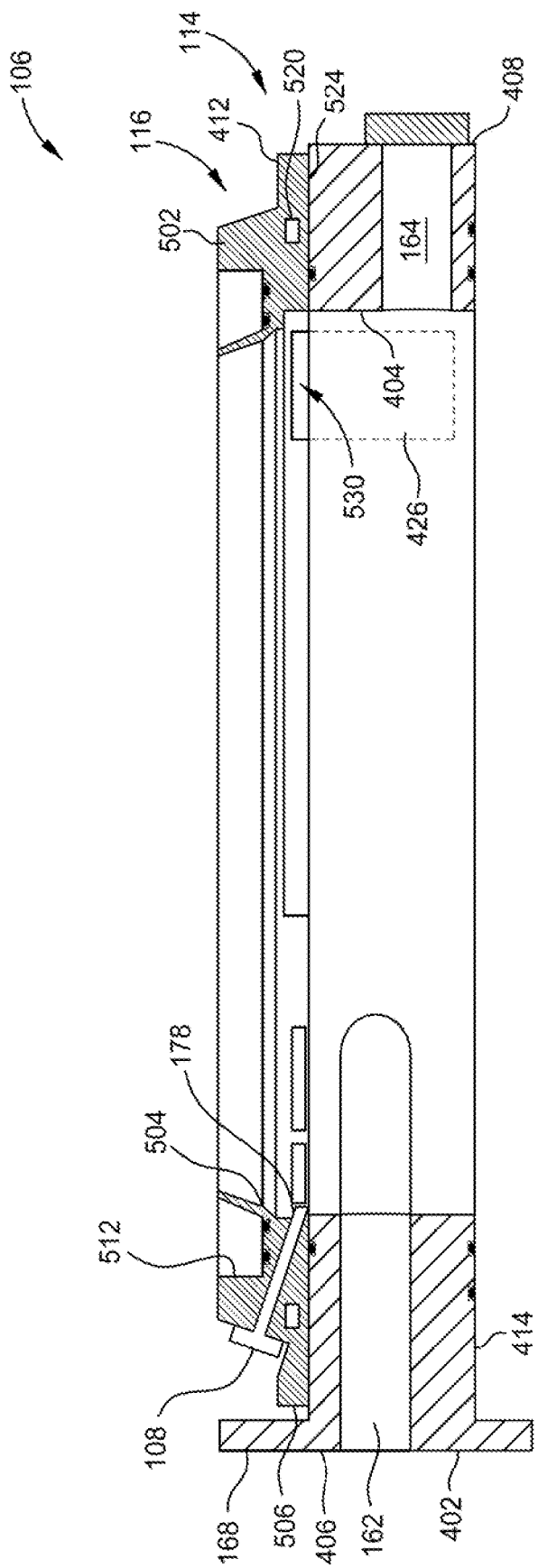
FIG. 4B is a schematic cross sectional view of the chamber body assembly of FIG. 4A taken through another plane, according to one or more embodiments described and discussed herein.

FIG. 4B is a schematic cross sectional view of the chamber body assembly 106 of FIG. 4A taken through another plane, according to one or more embodiments described and discussed herein. The cross section shown in FIG. 4B illustrates the lower chamber exhaust passage 164 and the relationship between the orientation of the lower chamber exhaust passage 164 and at least one of the upper chamber exhaust passage openings 424, the indent 530, and the upper chamber exhaust passage 426. The indent 530, the upper chamber exhaust passage opening 424, and the upper chamber exhaust passage 426 are disposed at an angle to the lower chamber exhaust passage 164 as described with reference to FIGS. 4D, 4E, and 5B. The indents 530 and the upper chamber exhaust passage openings 424 are additionally disposed above the lower chamber exhaust passage 164. The lower chamber exhaust passage 164 is configured to remove exhaust gases from the lower chamber region 113, while the upper chamber exhaust passage openings 424 are configured to remove exhaust gases from the upper chamber region 111.

Figure 4C:
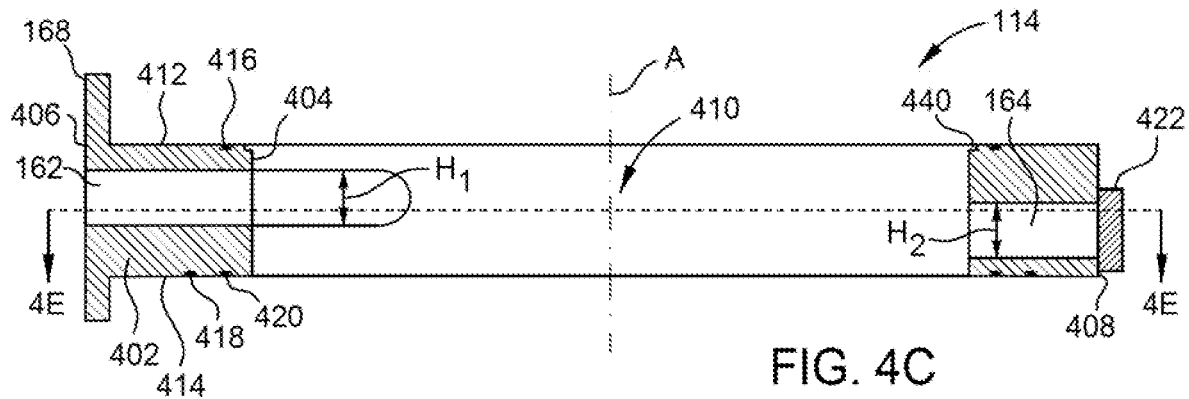
FIG. 4C is a schematic cross sectional view of a base ring, according to one or more embodiments described and discussed herein.

FIG. 4C is a schematic cross sectional view of the base ring 114. The base ring 114 includes a base ring body 402 with an opening 410 disposed therethrough. The opening 410 forms at least part of the process volume 110 of the overall process chamber assembly 100. The opening 410 is sized to allow the substrate and the substrate support assembly 124 to be disposed therein. The opening 410 is formed by the inner wall 404 of the base ring 114. The opening 410 extends from the top surface 412 of the base ring 114 to a bottom surface 414 of the base ring 114.

The base ring body 402 is the body of the base ring 114 and is formed of a metal material, such as steel, aluminum, copper, nickel, or a metal alloy. In some embodiments, the base ring body 402 may be a silicon carbide material or a doped silicon carbide material.

Figure 4D:
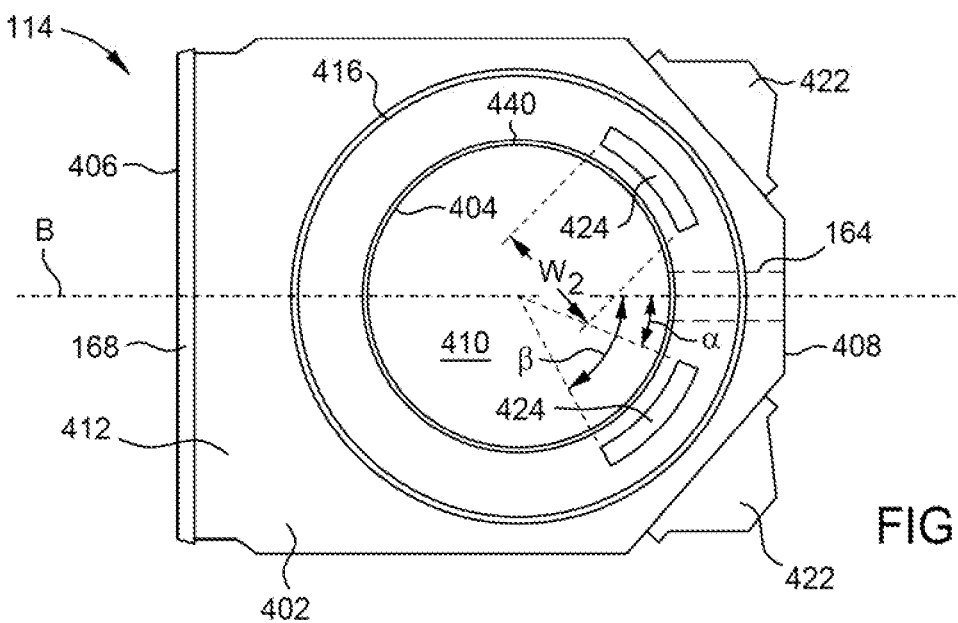
FIG. 4D is a schematic plan view of the base ring of FIG. 4C, according to one or more embodiments described and discussed herein.

As described above, the substrate transfer passage 162 is disposed opposite the one or more upper chamber exhaust passage openings 424 and the lower chamber exhaust passage 164. The substrate transfer passage 162 is disposed through a first side 406 of the base ring 114, while the one or more upper chamber exhaust passage openings 424 and the lower chamber exhaust passage 164 are formed through a second side 408 of the base ring 114. The first side 406 of the base ring 114 is disposed on one side of a plane C (FIG. 4E) disposed through the base ring 114, while the second side 408 of the base ring 114 is disposed on an opposite side of the plane C from the first side 406. The plane C passes through the central axis A and is perpendicular to the plane B. The plane C separates the substrate transfer passage 162 from the lower chamber exhaust passage 164 and the upper chamber exhaust passage openings 424. In the embodiment described herein, there are two upper chamber exhaust passage openings 424 are formed through the top surface 412 of the base ring 114 (FIG. 4D). The two upper chamber exhaust passage openings 424 are opposite the substrate transfer passage 162, but offset from being directly across from the substrate transfer passage 162. The two upper chamber exhaust passage openings 424 are offset to prevent the inward convergence of gas as it flows across the process volume 110 from the gas injectors 108 (FIGS. 1A-1B). The gas flow instead remains more evenly distributed across the process volume and enables more uniform deposition on the substrate 150. The two upper chamber exhaust passage openings 424 are disposed inward of a sealing groove 416.

The substrate transfer passage 162 has a height $H_1$ of about 7 mm to about 30 mm, such as about 10 mm to about 20 mm to enable the substrate 150 and a transfer arm (not shown) to be disposed therethrough. The substrate transfer passage 162 further has a width $W_1$ (FIG. 4E) of about 305 mm to about 350 mm, such as about 305 mm to about 315 mm. The width $W_1$ enables substrates 150 to pass therethrough and be placed on the susceptor assembly 124.

Referring additionally to FIGS. 1A-1B, the lower chamber exhaust passage 164 is disposed across from the substrate transfer passage 162 to put the lower chamber exhaust passage 164 in fluid communication with an exhaust pump (not shown). The exhaust pump may also be coupled to and in fluid communication with both of the upper chamber exhaust passage openings 424. As described herein, the lower chamber exhaust passage 164 is a cylindrical passage or an elliptic passage. The lower chamber exhaust passage 164 has a height $H_2$ of about 0 mm, about 1 mm, about 5 mm, or about 10 mm to about 75 mm, such as about 25 mm to about 50 mm. The height $H_2$ of the lower chamber exhaust passage 164 is configured to allow adequate lower chamber gas flow to pass therethrough along with a potential lift arm assembly (not shown).

Continuing to refer to FIG. 4C, the top surface 412 of the base ring body 402 includes a sealing groove 416 disposed therein. The sealing groove 416 circumscribes the inner wall 404 and is configured to receive a sealing ring, such as an O-ring or other sealing gasket. The sealing ring disposed within the sealing groove 416 may be a polymer or plastic with a hardness of greater than 50 durometer, such as greater than 60 durometer, such as greater than or about 65 durometer on the Shore A scale. The sealing groove 416 is sized to receive the sealing ring which forms a seal between the base ring 114 and the inject ring 116, as shown in FIGS. 1A-1B. The sealing groove 416 is disposed radially outward of the upper chamber exhaust passage openings 424 to prevent exhaust gases flowing through the upper chamber exhaust passage openings 424 from escaping from the process chamber assembly 100.

The top surface 412 optionally includes a support step 440. The support step 440 is a recess formed between the top surface 412 and the inner wall 404. The support step 440 is configured to support the flange 160 (FIGS. 1A-1B). The flange 160 is configured to be disposed at least partially within the support step 440 of the base ring 114 and the inject ring 116 to hold the flange 160 in place.

The bottom surface 414 of the base ring body 402 includes a first sealing groove 418 and a second sealing groove 420. The first sealing groove 418 and the second sealing groove 420 are concentric and circumscribe the inner wall 404 along the bottom surface 414. The first sealing groove 418 is disposed further outward from the axis A than the second sealing groove 420, such that the first sealing groove 418 circumscribes the second sealing groove 420. Each of the first sealing groove 418 and the second sealing groove 420 are configured to receive a sealing ring, such as an O-ring or other sealing gasket. The sealing ring disposed within the first sealing groove 418 and the second sealing groove 420 may be a polymer or plastic with a hardness of greater than 50 durometer, such as greater than 60 durometer, such as greater than or about 65 durometer on the Shore A scale. The first sealing groove 418 and the second sealing groove 420 are sized to receive the sealing ring and enable a seal to be formed between the base ring 114 and the peripheral supports 170 of the lower window 120 as shown in FIGS. 1A-1B.

Figure 4E:
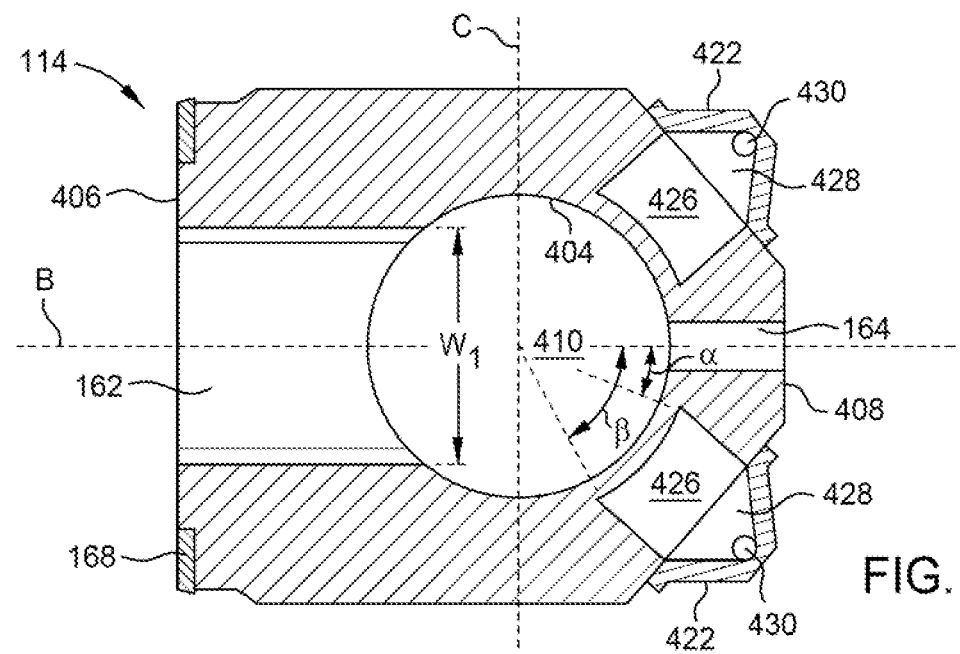
FIG. 4E is a schematic cross sectional view of the base ring taken through section line 4E-4E of FIG. 4C, according to one or more embodiments described and discussed herein.

FIG. 4D is a schematic plan view of the base ring 114 of FIG. 4C. As shown in FIG. 4D, the top surface 412 includes one or more upper chamber exhaust passage openings 424 disposed therethrough. The one or more upper chamber exhaust passage openings 424 are disposed between the inner wall 404 and the sealing groove 416. The one or more upper chamber exhaust passage openings 424 are in fluid communication with a portion of the upper liner 156 and the inject ring 116 to remove process gases from an upper portion of the process volume 110. Each of the one or more upper chamber exhaust passage openings 424 are each in fluid communication with an exhaust module 422 via an upper chamber exhaust passage 426. The upper chamber exhaust passage 426 is a passage disposed through the base ring body 402 (FIG. 4E). The upper chamber exhaust passage 426 fluidly couples one of the exhaust modules 422 to one of the upper chamber exhaust passage openings 424. As shown in FIG. 4D there are two exhaust modules 422 attached to the second side 408 of the base ring body 402. Each of the two exhaust modules 422 are disposed on opposite sides of the lower chamber exhaust passage 164, such that each of the exhaust modules 422 are disposed on opposite sides of and mirrored over a plane B. The plane B passes through the central axis A, the center of the substrate transfer passage 162, and the lower chamber exhaust passage 164 (FIG. 4E). The plane B is a vertically oriented plane and divides the base ring 114 in half, such that the base ring 114 is mirrored across the plane B. The same plane B is utilized with reference to the inject ring as shown in FIG. 5B.

The one or more upper chamber exhaust passage openings 424 each have a width $W_2$ of about 10 mm to about 220 mm, such as about 20 mm to about 150 mm. The width $W_2$ of each of the upper chamber exhaust passage openings 424 enables exhaust gases from within the process volume 110 to be removed while reducing the turbulence of the gas flow within the process volume 110.

Each of the upper chamber exhaust passage openings 424 are disposed between a first exhaust angle α and a second exhaust angle β with respect to the plane B. The first exhaust angle α is an angle of about 5 degrees to about 45 degrees with respect to the plane B, such as about 10 degrees to about 30 degrees with respect to the plane B, such as about 10 degrees to about 25 degrees with respect to the plane B. The first exhaust angle α is large enough to prevent the upper chamber exhaust passage 426 from intersecting the lower chamber exhaust passage 164.

The second exhaust angle β is an angle of about 30 degrees to about 70 degrees, such as about 35 degrees to about 65 degrees, such as about 45 degrees to about 60 degrees. The second exhaust angle β is great enough to capture gas directed across the opening 410 by one or more gas injectors 108 without substantial curvature of the gas paths inward towards the plane B. The difference between the first exhaust angle α and the second exhaust angle β is about 25 degrees to about 60 degrees, such as about 30 degrees to about 50 degrees. The different between the first exhaust angle α and the second exhaust angle β enables the upper chamber exhaust passage openings 424 to be disposed around a desired circumference of the opening 410, such that the difference is the amount of the base ring 114 around which the upper chamber exhaust passage openings 424 extend.

FIG. 4E is a schematic cross sectional plan view of the base ring 114 of FIG. 4C through section line 4E-4E. As shown in FIG. 4E, each of the upper chamber exhaust passages 426 fluidly connect to an exhaust module passage 428 disposed through each of the exhaust modules 422. The exhaust module passage 428 is in fluid communication with the upper chamber exhaust passage opening 424 via the upper chamber exhaust passage 426. The exhaust module passage 428 narrows as the exhaust module passage 428 extends further from the base ring body 402 until the exhaust module passage 428 is exposed to an exhaust outlet 430. The exhaust outlet 430 is an opening formed through a wall of the exhaust module passage 428 and configured to be coupled to an exhaust conduit (not shown) for removal of the exhaust gas from the process chamber assembly 100. Similarly to the upper chamber exhaust passage openings 424, the upper chamber exhaust passages 426 are disposed between the first exhaust angle α and the second exhaust angle β with respect to the plane B.

FIG. 5A is a schematic cross sectional view of the inject ring 116, according to one or more embodiments described and discussed herein. The inject ring 116 is configured to sit on top of the base ring 114 and provide process gases to the process volume 110. The inject ring 116 is a separate component from the base ring 114. The inject ring 116 is configured to inject gas across the surface of a substrate, such that the predominant flow of gas through the process volume 110 is in a horizontal direction. The separable inject ring 116 enables the inject ring 116 to be easily replaced and maintained without replacing or removing the entirety of the chamber body assembly 106. This reduces replacement costs and allows for new gas injection improvements to be more easily implemented with the process chamber assembly 100 with minimal impact to other chamber components.

The injection ring 116 includes an inner surface 504 and an outer surface 506. The inner surface 504 forms a ring around an opening 510 disposed within the inject ring 116. The opening 510 forms at least part of the process volume 110 of the process chamber assembly 100. The inject ring 116 includes one or more gas injectors 108 disposed therethrough. The one or more gas injectors 108 extend through an inject ring body 502 from an injector support surface 514 and to the inner surface 504. The one or more gas injectors 108 as described herein are disposed through one or more injector passages 508. Each of the injector passages 508 are sized to receive one of the one or more gas injectors 108, such as one of the gas injectors 108. The injector passages 508 extend from the injector support surface 514 to the inner surface 504. The injector passages 508 extend downward as the injector passages 508 move from the injector support surface 514 to the inner surface 504. Extending downward is defined as the injector passages 508 being disposed further away from a top surface 518 of the inject ring 116 and closer to a bottom surface 524 of the inject ring 116 as the injector passages 508 move radially inward towards the inner surface 504.

The inner surface 504 includes a groove 536 disposed around a majority of the circumference of the inner surface 504, such as greater than 50% of the circumference of the inner surface 504, such as greater 60% of the circumference of the inner surface 504, such as greater than 70% of the circumference of the inner surface 504. The groove 536 is configured to receive a heating element, such as the upper heating element 158. The groove 536 is shown in FIG. 5A as being formed as part of the inner surface 504 and the bottom surface 524 of the inject ring 116. The inner surface 504 also includes two indents 530 disposed therein. The two indents 530 are disposed opposite the injector passages 508. The indents 530 are disposed within the groove 536 and extend deeper into the inject ring body 502 than the groove 536, such that the indents 530 extend further from the axis A than the groove 536.

The injector support surface 514 is a portion of the outer surface 506 of the inject ring body 502 along with an outer stepped surface 516. The injector support surface 514 is configured to hold the one or more gas injectors 108 in place by providing a surface to anchor a portion of the one or more gas injectors 108. The one or more gas outlets 178 are disposed through the inner surface 504 and angled downward towards a substrate 150 disposed within the process volume 110 (FIGS. 1A-1B).

The bottom surface 524 of the inject ring 116 is configured to contact the top surface 412 of the base ring 114. The bottom surface 524 is a planar surface extending between the outer surface 506 and the inner surface 504. The outer stepped surface 516 extends from the outermost portion of the outer surface 506 to a bottom distal end of the injector support surface 514. The injector support surface 506 extends from the outer stepped surface 516 away from the bottom surface 524. The injector support surface 514 is disposed at an angle to the bottom surface 524. The angle of the injector support surface 514 is at least partially dependent upon the desired downward angle of the injector passages 508 and the one or more gas injectors 108. In embodiments described herein, the angle of the injector support surface 514 with respect to the bottom surface 524 is greater than or about 45 degrees, such as about 45 degrees to about 85 degrees, such as about 60 degrees to about 80 degrees, such as about 70 degrees to about 80 degrees. The injector support surface 514 extends radially inward from the outer stepped surface 516, such that the distal end of the injector support surface 514 furthest from the outer stepped surface 516 is closer to the inner surface 504.

The top surface 518 of the inject ring 116 extends radially inward from the upper distal end of the injector support surface 514. The top surface 518 is a horizontal surface, such that the top surface 518 extends parallel to the bottom surface 524. The opposite distal end of the top surface 518 from the injector support surface 514 is attached to a window support trench 512. The window support trench 512 is a channel disposed along the upper surface of the inject ring 116. The window support trench 512 is configured to accept a peripheral support 172 of the upper window 122 therein. The window support trench 512 includes a first window sealing groove 520 and a second window sealing groove 522. Each of the first window sealing groove 520 and the second window sealing groove 522 are configured to receive a sealing ring, such as an O-ring or other sealing gasket. The sealing rings disposed within the first window sealing groove 520 and the second window sealing groove 522 may be a polymer or plastic with a hardness of greater than 50 durometer, such as greater than 60 durometer, such as greater than or about 65 durometer on the Shore A scale. The first window sealing groove 520 and the second window sealing groove 522 are sized to receive the sealing ring and enable a seal to be formed between the inject ring 116 and the upper window 122 as shown in FIGS. 1A-1B.

The inner portion of the window support trench 512 is formed by an angled protrusion 511. The angled protrusion 511 is disposed inward of the first window sealing groove 520 and the second window sealing groove 522. The angled protrusion 511 extends upward from the window support trench 512 and away from the bottom surface 508. The angled protrusion 511 forms a portion of the window support trench 512 disposed on the innermost side of the angled protrusion 511 and a portion of the inner surface 504 on the outermost side of the angled protrusion 511. The angled protrusion 511 extends radially inward while extending upward from the window support trench 512. The angled protrusion 511 shields a portion of the upper window 122, such as the peripheral support 172, from the process volume 110 (FIGS. 1A-1B). Shielding the peripheral support 172 from the process volume 110 reduces the heating load on the peripheral support 172 and the seals within the first window sealing groove 520 and the second window sealing groove 522. The angled protrusion 511 additionally protects sealing rings disposed within the support trench 512 from being directly exposed to radiant energy or process gases, thus extending the lift and reliability of the sealing rings.

A coolant passage 521 is optionally disposed through the inject ring body 502. The coolant passage 521 is configured to receive a coolant fluid, such as water or oil. The coolant passage 521 is a partial ring disposed through the inject ring body 502 and assists in controlling the temperature of both the inject ring 116 and the base ring 114.

FIG. 5B is a schematic plan view of the inject ring 116 of FIG. 5A having a plurality of gas injectors 108. Five gas injectors 108 are illustrated in FIG. 5B. Other quantities of gas injectors 108 are also envisioned, such as three or more gas injectors 108, four or more gas injectors 108, five or more gas injectors 108, or six or more gas injectors 108. The number of gas injectors 108 determines the number of zones in which the process gases are injected into the process volume 110 (FIGS. 1A-1B). The group of gas injectors 108 are centered about the plane B. The plane B is the same plane B which passes through the base ring 114. The plane B is disposed through the central axis A and is perpendicular to a plane D. Each of the gas injectors 108 may have a plurality of individual process gas passages disposed therein (not shown). In embodiments wherein five gas injectors 108 are utilized, a central gas injector 532a forms an inner gas inject zone, two outermost gas injectors 532c form an outer gas inject zone, and two intermediate gas injectors 532b between the central gas injector 532a and the outermost gas injectors 532c form an intermediate gas inject zone. The plane B is disposed through the central gas injector 532a. The two intermediate gas injectors 532b are mirrored across the plane B. Similarly, the two outermost gas injectors 532c are mirrored across the plane B. Each of the injector passages 508 have a gas injector 108 disposed therethrough. The number of injector passages 508 is equal to the number of gas injectors 108.

Each of the injector passages 508 have an injector passage width $W_3$. The injector passage width $W_3$ of each of the injector passages 508 is shown as being the same. In alternative embodiments, the injector passage width $W_3$ varies as the injector passages 508 extend outward from a central gas injector 532a to the outermost gas injectors 532c. In some embodiments, the injector passage width $W_3$ of the injector passages 508 through which the outermost gas injectors 532c extend is greater than the injector passage width $W_3$ of the injector passages 508 through which the intermediate gas injectors 532b extend. The injector passages 508 through which the intermediate gas injectors 532b extend has a greater inject passage width $W_3$ than the injector passage width $W_3$ of the injector passage 508 through which the central gas injector 532a extends.

Alternatively, the injector passage widths $W_3$ are reduced as the injector passages 508 extend outward from the injector passage 508 through which the central gas injector 532a is disposed. In this embodiment, the injector passage width $W_3$ of the injector passages 508 through which the outermost gas injectors 532c extend is less than the injector passage width $W_3$ of the injector passages 508 through which the intermediate gas injectors 532b extend. The inject passage width $W_3$ of the injector passages 508 through which the intermediate gas injectors 532b extend is less than the injector passage width $W_3$ of the injector passage 508 through which the central gas injector 532a extends.

Each of the injector passages 508 are disposed at an injector angle γ with respect to the plane B. The injector angle γ is taken with respect to the plane B, but on the opposite side of the plane D with respect to the first exhaust angle α and the second exhaust angle β. The injector angle γ is less than or about 70 degrees from the plane B, such as less than or about 65 degrees from the plane B, such as less than or about 60 degrees from the plane B. The injector angle γ is configured to be within 10 degrees of the second exhaust angle β, such that the difference between the injector angle γ and the second exhaust angle β is about −10 degrees to about 10 degrees, such as about −5 degrees to about 5 degrees, about −3 degrees to about 3 degrees, or about −1 degrees to about 1 degrees, such as about 0 degrees. The injector angle γ and the second exhaust angle β are similar to reduce deflection of gases injected into the process volume 110 by the gas injectors 108 as the gases are exhausted. Deflecting the gases may cause non-uniformities in film deposition.

The inject ring 116 includes indents 530 within the inner surface 504 opposite the injector passages 508. The indents 530 correspond to the one or more upper chamber exhaust passage openings 424 (FIG. 4D). The indents 530 are disposed over the one or more upper chamber exhaust passage openings 424, such that the indents 530 serve as a first portion of the one or more upper chamber exhaust passages 426 of the base ring 114 (FIG. 4A). In the embodiment described herein, there are two indents 530 which correspond to two upper chamber exhaust passages 426. The two indents 530 are disposed on an opposite side of the opening 510 from the injector passages 508. The two indents 530 are disposed on one side of the plane D which passes through the inject ring 116, while the injector passages 508 are disposed on the opposite side of the plane D. The two indents 530 are offset from the center of the inject ring 116 across from the injector passage 508 through which the central gas injector 532a is disposed. Neither of the indents 530 are disposed through the plane B. The indents 530 are mirrored across the plane B. As described above, offsetting the two indents 530 prevents the inward convergence of gas as it flows across the process volume 110 from the gas injectors 108 (FIGS. 1A-1B) and to the upper chamber exhaust passages 426.

As described herein, the indents 530 are similar in size and shape to the one or more upper chamber exhaust passage openings 424. Each of the indents 530 have a width $W_4$ of about 0 mm, about 1 mm, about 2 mm, or about 5 mm to about 220 mm, such as about 10 mm to about 150 mm. The width $W_4$ corresponds to the width $W_2$ of the upper chamber exhaust passage openings 424 (FIG. 4D). The width $W_4$ is configured to reduce the disruption of gas flow within the process volume 110 to allow for primarily laminar gas flow and uniform deposition on the substrate 150. Similarly to the upper chamber exhaust passage openings 424, the indents 530 are disposed between the first exhaust angle α and the second exhaust angle β with respect to the plane B.

The inject ring body 502 forms the inject ring 116 and is formed of a metal material, such as steel, aluminum, copper, nickel, or metal alloy. In some embodiments, the inject ring body 502 may be fabricated from a silicon carbide material or a doped silicon carbide material.

The components described herein allow greater uniformity and deposition control within a process chamber, such as the process chamber assembly. Although illustrated together in one process chamber assembly herein, components described herein may be utilized separately with existing or alternative deposition process chambers.

Embodiments of the present disclosure further relate to any one or more of the following paragraphs 1-20:

1. A method for epitaxially depositing a material on a substrate, comprising: positioning a substrate on a substrate support surface of a susceptor within a process volume of a chamber body, wherein the process volume comprises an upper chamber region and a lower chamber region, and wherein the substrate support surface is in the upper chamber region and a lower surface of the susceptor is in the lower chamber region during an epitaxy process; flowing a process gas comprising a chemical precursor from an upper gas inlet on a first side of the chamber body, across the substrate, and to an upper gas outlet on a second side of the chamber body during the epitaxy process; flowing a purge gas from a lower gas inlet on the first side of the chamber body, across the lower surface of the susceptor, and to a lower gas outlet on the second side of the chamber body during the epitaxy process; and maintaining a pressure of the lower chamber region greater than a pressure of the upper chamber region during the epitaxy process.

2. A method for epitaxially depositing a material on a substrate, comprising: positioning a substrate on a substrate support surface of a susceptor within a process volume of a chamber body, wherein the process volume comprises an upper chamber region and a lower chamber region, and wherein the substrate support surface is in the upper chamber region and a lower surface of the susceptor is in the lower chamber region during an epitaxy process; flowing a process gas comprising a silicon precursor from an upper gas inlet on a first side of the chamber body, across the substrate, and to an upper gas outlet on a second side of the chamber body during the epitaxy process; flowing a purge gas from a lower gas inlet on the first side of the chamber body, across the lower surface of the susceptor, and to a lower gas outlet on the second side of the chamber body during the epitaxy process; and maintaining a pressure of the lower chamber region at about 1% to about 5% greater than a pressure of the upper chamber region during the epitaxy process by one or more of: increasing an exhaust rate of the process gas through the upper gas outlet; decreasing an exhaust rate of the purge gas through the lower gas outlet; or increasing a flow rate of the purge gas through the lower gas inlet.

3. The method according to paragraph 1 or 2, wherein the pressure of the lower chamber region is maintained about 0.5% to about 10% greater than the pressure of the upper chamber region.

4. The method according to paragraph 3, wherein the pressure of the lower chamber region is maintained about 1% to about 5% greater than the pressure of the upper chamber region.

5. The method according to paragraphs 3 or 5, further comprising independently maintaining each of the pressures of the lower chamber region and the upper chamber region at about 5 Torr to about 25 Torr.

6. The method according to any one of paragraphs 1-5, wherein the pressure of the lower chamber region is maintained greater than the pressure of the upper chamber region by increasing an exhaust rate of the process gas through the upper gas outlet.

7. The method according to any one of paragraphs 1-6, wherein the pressure of the lower chamber region is maintained greater than the pressure of the upper chamber region by decreasing an exhaust rate of the purge gas through the lower gas outlet.

8. The method according to any one of paragraphs 1-7, wherein the pressure of the lower chamber region is maintained greater than the pressure of the upper chamber region by increasing a flow rate of the purge gas through the lower gas inlet.

9. The method according to any one of paragraphs 1-8, wherein the purge gas comprises nitrogen gas ($N_2$), argon, helium, hydrogen, or any combination thereof, and wherein the chemical precursor comprises silane, disilane, trisilane, chlorosilane, dichlorosilane, tetrachlorosilane, hexachlorodisilane, or any combination thereof.

10. The method according to any one of paragraphs 1-9, wherein a gap is disposed peripherally and radially around the susceptor, wherein the gap is disposed between the susceptor and an inner surface of the chamber body, and wherein the upper chamber region and the lower chamber region are in fluid communication with each other through the gap.

11. A process chamber assembly for processing a substrate, comprising: a chamber body; a process volume contained within the chamber body, wherein the process volume comprises an upper chamber region and a lower chamber region; a substrate support assembly comprising a susceptor having a substrate support surface opposite a lower surface disposed within the process volume, wherein the substrate support assembly is configured to vertically position the susceptor between a loading position and a processing position within the processing region, and wherein the substrate support surface is in the upper chamber region and the lower surface is in the lower chamber region when the susceptor is in the processing position; a first gas system in the upper chamber region, the first gas system comprising an upper gas inlet on a first side of the chamber body and an upper gas outlet on a second side of the chamber body which is opposite of the first side; a second gas system in the lower chamber region, the second gas system comprising a lower gas inlet on the first side of the chamber body and a lower gas outlet on the second side of the chamber body; and a gap disposed peripherally and radially around the susceptor, wherein the gap is disposed between the susceptor and an inner surface of the chamber body, and wherein the upper chamber region and the lower chamber region are in fluid communication with each other through the gap.

12. The process chamber according to paragraph 11, further comprising a control unit configured to maintain a pressure of the lower chamber region greater than a pressure of the upper chamber region.

13. The process chamber according to paragraph 12, wherein the pressure of the lower chamber region is about 0.5% to about 10% greater than the pressure of the upper chamber region.

14. The process chamber according to paragraph 12 or 13, wherein the control unit is configured to independently maintain each of the pressures of the lower chamber region and the upper chamber region at about 5 Torr to about 25 Torr.

15. The process chamber according to any one of paragraphs 11-14, further comprising an upper lamp module and a lower lamp module, and wherein the susceptor is disposed between the upper lamp module and the lower lamp module.

16. The process chamber according to paragraph 15, further comprising: an upper window disposed between the upper lamp module and the susceptor; and a lower window disposed between the lower lamp module and the susceptor.

17. The process chamber according to paragraph 16, further comprising a base ring disposed between the upper lamp module and the lower lamp module, wherein the base ring comprises: a base ring body having an inner base ring surface and an outer base ring surface; a substrate transfer passage disposed through the inner base ring surface and the outer base ring surface; a lower chamber exhaust passage disposed opposite the substrate transfer passage and through the inner surface and the outer surface; and one or more upper chamber exhaust passages.

18. The process chamber according to paragraph 17, wherein the substrate transfer passage comprises the lower gas inlet on the first side of the chamber body, and wherein the lower chamber exhaust passage comprises the lower gas outlet on the second side of the chamber body.

19. The process chamber according to paragraph 17 or 18, further comprising an inject ring disposed on top of the base ring and between the upper lamp module and the lower lamp module, wherein the inject ring comprises: an inject ring body having an inner inject ring surface and an outer inject ring surface; and one or more injector passages disposed between the inner inject ring surface and the outer inject ring surface and above the substrate transfer passage.

20. The process chamber according to paragraph 19, wherein the one or more injector passages comprise the upper gas inlet on the first side of the chamber body, and wherein the one or more upper chamber exhaust passages comprise the upper gas outlet on the second side of the chamber body.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated. As used herein, the term "about" refers to a +/−10% variation from the nominal value. It is to be understood that such a variation can be included in any value provided herein.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method for epitaxially depositing a material on a substrate, comprising:
    positioning a substrate on a substrate support surface of a susceptor within a process volume of a chamber body, wherein the process volume comprises an upper chamber region and a lower chamber region, and wherein the substrate support surface is in the upper chamber region and a lower surface of the susceptor is in the lower chamber region during an epitaxy process;
    flowing a process gas comprising a chemical precursor from an upper gas inlet on a first side of the chamber body, across the substrate, and to a plurality of upper gas outlets on a second side of the chamber body during the epitaxy process, wherein each upper gas outlet of the plurality of gas outlets is fluidly coupled to an exhaust module via an upper chamber exhaust passage disposed between a first exhaust angle of about 5 degrees to about 45 degrees with respect to a vertically oriented plane and a second exhaust angle of about 30 degrees to about 70 degrees with respect to the vertically oriented plane, wherein the upper chamber exhaust passage has a width of about 10 mm to about 220 mm, and wherein the upper chamber exhaust passage is fluidly coupled to a first pump source configured to maintain an upper chamber pressure of about 1 Torr to about 760 Torr;
    flowing a purge gas from a lower gas inlet on the first side of the chamber body, across the lower surface of the susceptor, and to a lower gas outlet on the second side of the chamber body during the epitaxy process, wherein the lower gas outlet is fluidly coupled to a second pump source via a lower chamber exhaust passage, wherein the second pump source is configured to maintain a lower chamber pressure of about 1 Torr to about 760 Torr, and wherein the lower chamber pressure is different than the upper chamber pressure, wherein the vertically oriented plane extends collinearly along a major axis of the lower chamber exhaust passage; and
    maintaining a pressure of the lower chamber region greater than a pressure of the upper chamber region during the epitaxy process.

2. The method of claim 1, wherein the pressure of the lower chamber region is maintained about 0.5% to about 10% greater than the pressure of the upper chamber region.

3. The method of claim 2, wherein the pressure of the lower chamber region is maintained about 1% to about 5% greater than the pressure of the upper chamber region.

4. The method of claim 2, further comprising independently maintaining each of the pressures of the lower chamber region and the upper chamber region at about 5 Torr to about 25 Torr.

5. The method of claim 1, wherein the pressure of the lower chamber region is maintained greater than the pressure of the upper chamber region by increasing an exhaust rate of the process gas through the upper gas outlet.

6. The method of claim 1, wherein the pressure of the lower chamber region is maintained greater than the pressure of the upper chamber region by decreasing an exhaust rate of the purge gas through the lower gas outlet.

7. The method of claim 1, wherein the pressure of the lower chamber region is maintained greater than the pressure of the upper chamber region by increasing a flow rate of the purge gas through the lower gas inlet.

8. The method of claim 1, wherein the purge gas comprises nitrogen gas ($N_2$), argon, helium, hydrogen, or any combination thereof, and wherein the chemical precursor comprises silane, disilane, trisilane, chlorosilane, dichlorosilane, tetrachlorosilane, hexachlorodisilane, or any combination thereof.

9. The method of claim 1, wherein a gap is disposed peripherally and radially around the susceptor, wherein the gap is disposed between the susceptor and an inner surface of the chamber body, and wherein the upper chamber region and the lower chamber region are in fluid communication with each other through the gap.

10. The method of claim 1, wherein maintaining the pressure comprises operating a control unit.

11. The method of claim 10, wherein the control unit is configured to operate a flow control device.

12. The method of claim 11, wherein the flow control device controls a flow rate of the upper gas inlet.

13. The method of claim 11, wherein the flow control device controls a flow rate of the upper gas outlet.

14. The method of claim 11, wherein the flow control device controls a flow rate of the upper chamber exhaust passage.

15. The method of claim 11, wherein the flow control device controls a flow rate of the exhaust module.

16. The method of claim 11, wherein the flow control device comprises a flow restrictor.

17. The method of claim 11, wherein the flow control device comprises a valve.

18. A method for epitaxially depositing a material on a substrate, comprising:
    positioning a substrate on a substrate support surface of a susceptor within a process volume of a chamber body, wherein the process volume comprises an upper chamber region and a lower chamber region, and wherein the substrate support surface is in the upper chamber region and a lower surface of the susceptor is in the lower chamber region during an epitaxy process;
    flowing a process gas comprising a chemical precursor from an upper gas inlet on a first side of the chamber body, across the substrate, and to a plurality of upper gas outlets on a second side of the chamber body during the epitaxy process, wherein each upper gas outlet of the plurality of gas outlets is fluidly coupled to an exhaust module via an upper chamber exhaust passage disposed between a first exhaust angle of about 5 degrees to about 45 degrees with respect to a vertically oriented plane and a second exhaust angle of about 30 degrees to about 70 degrees with respect to the vertically oriented plane, wherein the upper chamber exhaust passage has a width of about 10 mm to about 220 mm, and wherein the upper chamber exhaust passage is fluidly coupled to a first pump source configured to maintain an upper chamber pressure of about 1 Torr to about 760 Torr;
    flowing a purge gas from a lower gas inlet on the first side of the chamber body, across the lower surface of the susceptor, and to a lower gas outlet on the second side of the chamber body during the epitaxy process, wherein the lower gas outlet is fluidly coupled to a second pump source via a lower chamber exhaust passage, wherein the second pump source is configured to maintain a lower chamber pressure of about 1 Torr to about 760 Torr, and wherein the lower chamber pressure is different than the upper chamber pressure, wherein the vertically oriented plane extends collinearly along a major axis of the lower chamber exhaust passage; and
    maintaining a pressure of the lower chamber region at about 1% to about 5% greater than a pressure of the upper chamber region during the epitaxy process by one or more of:
        increasing an exhaust rate of the process gas through the upper gas outlet;
        decreasing an exhaust rate of the purge gas through the lower gas outlet; or
        increasing a flow rate of the purge gas through the lower gas inlet.

* * * * *